United States Patent [19]
Banghart et al.

[11] Patent Number: 5,714,776
[45] Date of Patent: Feb. 3, 1998

[54] COMPACT ISOLATION AND ANTIBLOOMING STRUCTURE FOR FULL-FRAME CCD IMAGE SENSORS OPERATED IN THE ACCUMLATION MODE

[75] Inventors: Edmund K. Banghart, Pittsford; Constantine N. Anagnostopoulos, Mendon, both of N.Y.

[73] Assignee: Eastman Kodak Company, Rochester, N.Y.

[21] Appl. No.: 560,555

[22] Filed: Nov. 17, 1995

[51] Int. Cl.⁶ .................. H01L 27/148; H01L 29/768
[52] U.S. Cl. .................. 257/223; 257/229; 257/230
[58] Field of Search ..................... 257/223, 229, 257/230

[56] References Cited

U.S. PATENT DOCUMENTS

| | | | |
|---|---|---|---|
| 4,593,303 | 6/1986 | Dyck et al. | 357/24 |
| 4,916,501 | 4/1990 | Thenoz et al. | 257/223 |
| 5,118,631 | 6/1992 | Dyck et al. | 457/29 |

*Primary Examiner*—Ngân V. Ngô
*Attorney, Agent, or Firm*—James D. Leimbach

[57] ABSTRACT

By introducing an n-type drain implant substantially below the surface of the p-type substrate of a full frame image sensor, then enclosing the drain on the bottom and the sides with a deep p-type implant, and accumulating the surface with a shallow p-type implant, with all implantations performed through the same mask aperture, the blooming control, channel stop, and dark current suppression features of the imager are compressed, increasing the fill factor, facilitating pixel miniaturization, and therefore enabling high resolution imaging applications.

14 Claims, 34 Drawing Sheets

COMPACT ISOLATION AND ANTIBLOOMING STRUCTURE FOR FULL-FRAME CCD IMAGE SENSORS OPERATED IN THE ACCUMLATION MODE

FIELD OF INVENTION

The present invention relates to the design of a full-frame CCD imager for high resolution imaging applications.

BACKGROUND OF THE INVENTION

Typically, a full-frame imager consists of a two-dimensional array of n-type buried channel CCD devices on a p-type substrate, where heavily doped p-type regions, perhaps accompanied by field oxidation steps, serve to isolate the buried channel CCD devices in the array into well-defined columns. Compensating p-type impurities are then introduced at regular intervals along the n-type buried channel CCD columns to create a series of alternating storage and transfer regions, where each storage region and its corresponding transfer region constitute an individual phase of the CCD column, or shift register. Electrons, photogenerated in the imager substrate, are collected by the buried channel CCDs into packets of charge representing the imaged object. The transfer of these electron packets down the CCD columns is controlled by appropriate clocking of electrodes that reside over each phase and are insulated from the buried channels by a thin gate oxide. Each independently operating image sensing and charge transferring unit in this two-dimensional array constitutes what is commonly known as a pixel of the full-frame CCD imager. Depending on the specific technology used, a pixel may contain one, two, three, or more, phases.

Often, high level illumination in a full-frame CCD imager array produces a deleterious effect, known as blooming, that results in excess carriers being generated in the image sensing region of one pixel and spilling over into adjacent pixels in the array. To prevent the blooming, an overflow drain is often incorporated into the pixel design to provide a means for discarding charge that exceeds a specified maximum level. However, the benefits derived from the structures currently available in the prior art to provide overflow protection are typically offset by several disadvantages. These disadvantages include a diminished pixel fill factor (that is, the relative fraction of the pixel devoted exclusively to imaging), which sets a lower limit on the pixel size due to dynamic range requirements; increased demands on lithographical accuracy, which lower the imager yield by making the device specifications sensitive to small mask misalignments; increasingly complex fabrication processes for the imager, which raise the total imager cost; and excessively large bias voltages, which encumber the design of the electrical operating system and decrease the convenience of electronic imaging.

A detailed review of the three principal types of overflow drain appearing in the prior art: the lateral overflow drain, the vertical overflow drain, and the lateral punch-through overflow drain, and their particular disadvantages for full frame imagers now follows.

One type of overflow drain described in the literature is the lateral overflow drain. The lateral overflow drain, or LOD, normally consists of three parts: a drain, a barrier region that sets the charge overflow level in the CCD pixels, and a spacer region between the barrier and the drain to allow for alignment errors. The drain is typically a heavily doped n-type region that is placed alongside the heavily doped p-type channel stop region. The barrier region, formed by a compensating p-type implant in the n-type CCD buried channel, is usually placed between the CCD and the drain. The spacer region provides a small offset for the barrier region from the drain region to allow for effective control against lithographical errors encountered in masking these various regions. Because the barrier region is relatively wide, with its potential determined by the degree of impurity compensation, the operation of the lateral overflow drain is static, that is, independent of the voltage applied to the drain. However, allocating space to build the lateral overflow drain, barrier, and spacer region removes valuable image-sensitive real estate, or fill factor, from the imager array and the resulting loss in dynamic range and quantum efficiency becomes proportionally greater as the pixel size is reduced in order to attain higher resolution full frame sensors.

Another type of overflow drain is the vertical overflow drain, or VOD. Such a structure places the overflow region deep in the substrate of the imager, below the n-type buried channel CCDs, and is formed by the diffusion of a deep p-type well into an n-type substrate. Contrary to the lateral overflow drain, the operation of the vertical overflow drain is dynamic, that is, determined by the voltage applied to the substrate contact. While the ability to discharge excess charge directly into the substrate allows a high fill factor, the voltage level required to activate the VOD is typically quite large. The location of the overflow drain in the substrate below the CCD buried channels may also interfere with the collection of long wavelength light. Furthermore, to create the p-type well places a heavier burden on the thermal budget during the fabrication sequence. For example, the p-well usually must be driven to a depth of 4 or 5 microns so as to be effective, requiring higher than usual furnace temperatures over an extended period of time in order to diffuse the p-type impurities deeply into the n-type silicon substrate.

Discharge to the substrate is also possible with a related structure, known as the buried overflow drain, wherein, excess electrons in the n-type buried channel CCDs are collected by a thin, heavily doped n-type layer buried uniformly perhaps 10 μm below the surface of a standard p-type substrate.

A third, and final, type of overflow drain is the lateral, punch-through overflow drain. In tow prior art patents, U.S. Pat. No. 4,593,303 and U.S. Pat. No. 5,118,631 issued, respectively Jun. 3, 1986 and Jun. 2, 1992, to Dyck and Early (hereinafter referred to as Dyck1, and Dyck2, respectively) a structure is described that provides an increased fill factor for full frame imaging devices by arranging the n-type drain to be entirely within the p-type channel stop. The application of a small voltage to the drain is then able to punch-through the intervening channel stop to directly access the adjacent n-type buried channel CCDs and discharge the excess electron charges. In this structure, the p-type and n-type impurities forming the channel stop and drain regions, respectively, are actually implanted through the same mask aperture, permitting these implants to be fully self-aligned to the buried channels. Significantly, because the p-type impurities in the channel stop implant have a higher lateral diffusion coefficient than the n-type impurities in the drain, the high temperature steps that follow these implantations in the device processing sequence ensure that, in the finished imager, the drain, channel stop, and CCD regions are appropriately configured so as to produce the required n-p-n punch-through structure.

While integrating the overflow drain and channel stop functions provides a considerable increase in fill factor, and obtaining self-alignment of the drain and channel stop implants to the buried channels promotes a higher yielding process, a major disadvantage of the aforementioned design is its inability to supply a large quantity of holes from the channel stops directly to the buried channel CCD devices during accumulation mode operation. Operation in the accumulation mode is an important technique used to reduce dark current generation during the charge integration interval. A large supply of holes enables the surface states at the silicon/silicon-dioxide interface to be completely filled with holes, quenching the electron generation and thus effectively suppressing the dark current generation. In Dyck1 and Dyck2, only a small amount of p-type impurities are available in the channel stop regions, on the outer fringes of the n-type Drain Implants. It is likely that in actual operation of this structure the channel stops may be almost entirely depleted of holes. Furthermore, in Dyck1 and Dyck2, it is evident that the n-type impurities of the drain are in actual contact with the substrate surface, creating a large supply of electrons at the surface and thus greatly weakening the channel stopping properties of the overall structure.

A structure related to Dyck1 and Dyck2 featuring direct gate control but with similar limitations with respect to the dark current suppression, is the lateral overflow gate and has been proposed by several prior art teachings. Lateral overflow drain structures have been disclosed in the prior art. However, these prior art devices do not provide for dark current suppression in frame transfer devices.

It should be apparent from the above discussion that there remains a need within the art for Lateral Overflow Drains that are more suited to frame transfer devices.

SUMMARY OF THE INVENTION

We now disclose an overflow drain structure for a full frame imager useful for high resolution applications that overcomes the deficiencies present in existing imagers incorporating either a lateral, vertical, or lateral punch-through overflow drain. Moreover, with such a structure, none of the desirable properties of channel isolation, blooming protection, and dark current suppression are compromised.

We have formally entitled our invention as "A Compact Isolation and Antiblooming Structure for Full-Frame CCD Image Sensors Operated in the Accumulation Mode". Specifically, the invention comprises:

a) a semiconductor substrate of p-type conductivity;

b) a standard buried channel CCD, formed by an implantation of n-type impurities uniformly over the substrate;

c) an overflow drain, formed by an implantation of n-type impurities introduced substantially below the surface of the semiconductor substrate through a narrow mask aperture, with a dose sufficiently large enough to ensure a region of high n-type conductivity;

d) a drain-encapsulating region, formed by an implantation of p-type impurities, introduced through the same aperture described above, and positioned in the substrate so as to completely envelope the n-type drain;

e) a Surface-Accumulatingregion (or channel stop), formed by an implantation of p-type impurities, introduced through the same aperture described above, and positioned in the substrate above the overflow drain, near the surface of the substrate, with a dose sufficiently large enough to ensure that the n-type impurities introduced into this region by the Buried Channel Implant in step (b) are fully compensated and that the region is permanently accumulated with holes; and optionally f) a means for altering the width of the aperture described in step (c) so that the opening in the mask seen by the Drain Implant is effectively smaller than that seen by both the Drain-Encapsulating Implant and the Surface-Accumulating Implant. Such means are useful in containing the lateral extent of the n-type drain impurities and in making sure that these impurities remain fully separated from the n-type buried channel impurities by the intervening p-type impurities from the Drain-Encapsulating Implant.

In the arrangement disclosed above, the drain serves as an n-type conductor, buried in the p-type imager substrate. The drain is separated on both sides from the n-type buried channel CCDs by the thin, lightly doped, p-type drain-encapsulating region. Furthermore, the drain is shielded from the surface by the heavily doped, p-type Surface-Accumulatingregion. Antiblooming control is enabled by the application of a small bias to the drain such that the p-type drain-encapsulating region is depleted, causing the potential barrier between the drain and the buried channel to be removed by the well-known punch-through mechanism. At the same time, the heavily doped p-type surface accumulating region serves to increase the supply of majority carrier holes to the surface of the buried channel CCDs for the purpose of dark current suppression in the accumulation mode. Setting the punch-through voltage between the drain and the buried channel CCDs is easily facilitated by adjusting the impurity level (dosage) of the Drain and Drain-Encapsulating Implants, adjusting the depth (energy) of the Drain and Drain-Encapsulating Implants in the substrate, adjusting the width of the mask aperture, or by any combination of these treatments.

In summary, by disclosing a new structure consisting of a drain region, a drain-encapsulating region, and a Surface-Accumulatingregion, formed by ion implantation and introduced through a single mask opening in the imager substrate, we have made significant improvements over the prior art in compressing the channel isolation, blooming control, and dark current suppression features of full-frame imagers. Specifically, by vertically integrating these features in the imager, our invention greatly facilitates the reduction of pixel size and, therefore, the development of low cost, high resolution imaging arrays.

The above and other objects of the present invention will become more apparent when taken in conjunction with the following description and drawings wherein identical reference numerals have been used, where possible, to designate identical elements that are common to the figures.

ADVANTAGEOUS EFFECT OF THE INVENTION

The present invention has the following advantages. The Drain, Drain-Encapsulating, and Surface-Accumulating Implants are all introduced through the same mask opening, the functional aspects of channel isolation, blooming protection, and dark current suppression are fused into a compact vertical arrangement. As a result, a considerable gain in fill factor is possible for the structure we are disclosing over designs referenced in the prior art incorporating an LOD, in which the various regions are relatively wide and have a lateral arrangement over the surface of the imager. Furthermore, because the Drain, Drain-Encapsulating, and Surface-Accumulating Implants are fully self-aligned to the Buried Channel Implant, the space normally allocated for misalignment tolerances can be recovered. Indeed, in the structure we are disclosing, the width of the mask opening can be set at the minimally achievable lithographical limit.

The blooming suppression mechanism can be activated with relatively small bias levels on the drain, the structure we are disclosing eliminates the need for the large substrate voltages necessary to activate the anti-blooming function in imagers incorporating a Verticle Overflow Drain (VOD) structure. Lower voltage requirements greatly simplify the electrical operating system of the imager, reduce the overall size and cost of the CCD camera, and in general provide greater convenience in electronic imaging for consumer applications. Moreover, the structure we are disclosing eliminates the need for the intensive thermal processing required by imager arrays incorporating the VOD structure to drive the deep p-type wells. Also, by eliminating the VOD, the collection of long wavelength (red) light is greatly improved, since a greater depth of the substrate can be used for imaging.

As a final advantage, because a large supply of majority carrier holes is immediately available from both sides of the Surface-Accumulatingregion (or channel stop region) to the buried channel CCDs, the structure we are disclosing is highly suitable for operation in the accumulation mode, for the purpose of dark current suppression. Similar designs available from the prior art are deficient in this regard.

BRIEF DESCRIPTION OF THE DRAWINGS

The invention is illustrated in the accompanying drawings (not all drawn to scale) in which.

DETAILED DESCRIPTION OF THE INVENTION

Figure 1:
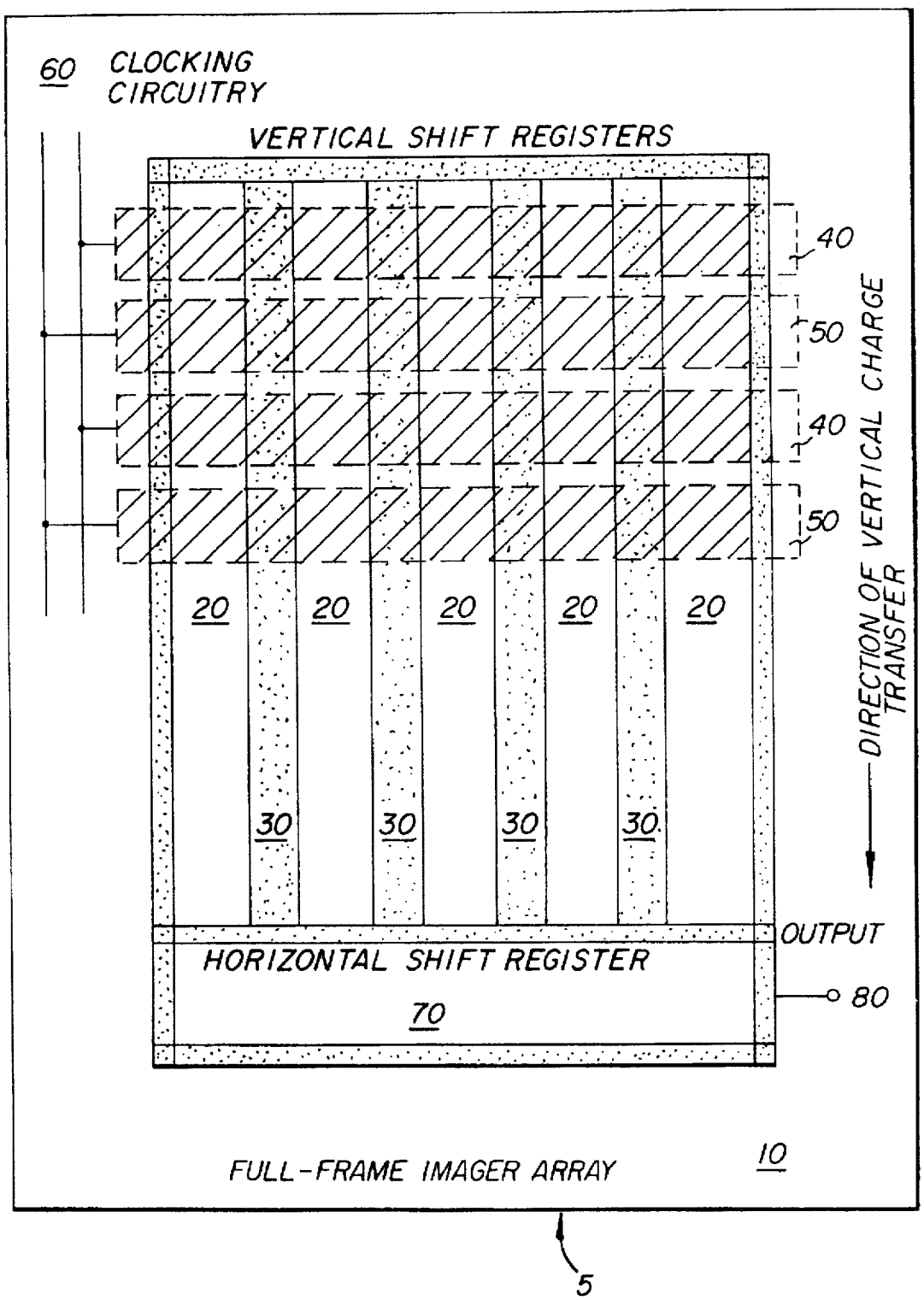
FIG. 1 is a schematic view of a full frame imager, formed on a p-type semiconductor substrate and composed of n-type buried channel CCD devices arranged into multiple vertical shift registers, a horizontal shift register, an output structure, and with a two-phase clocking circuitry.

The preferred embodiment of the present invention is illustrated in FIG. 1, wherein a full frame imaging array 5. The imaging array is formed on a p-type semiconductor substrate 10 which has multiple columns of n-type buried channel charge-coupled devices, more commonly known as the vertical CCD shift registers 20, introduced into the substrate. The n-type vertical shift registers 20 are isolated from one another by heavily doped p-type channel stops 30. It is the vertical shift registers 20 of the imager that take the light from the viewed object that is allowed to fall on the CCD elements, and converts the incident light to electrons, which are photogenerated and collected during a time interval known as the integration period.

In the direction orthogonal to the CCD columns are arranged over an insulating gate oxide (not shown) two alternating polysilicon gates 40 and 50, to which can be applied a sequence of voltages by the clocking circuitry 60. After the image has been integrated, the polysilicon gates are clocked so that the integrated charge can be transferred out of the vertical shift registers into the horizontal shift register 70. The charge is then converted into a voltage at the output node 80 of the imager. These transfers constitute what is known as the read-out period of the imager. During read-out, the imager is shuttered so that new charges are not mixed with the information already present in the imager.

Figure 2:
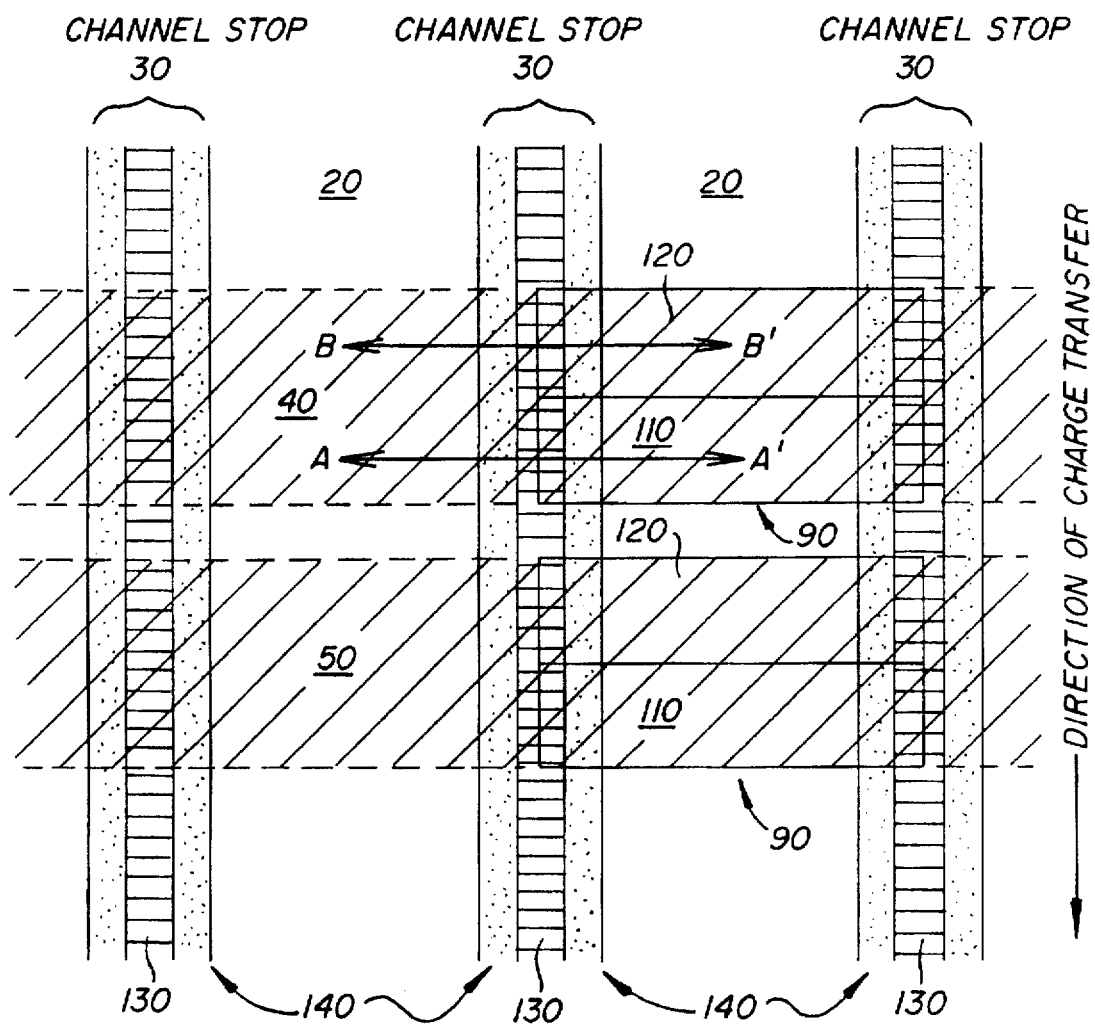
FIG. 2 is an enlarged view of one pixel of a full frame imager, showing the architectural features of the n-type buried channel CCDs, and highlighting the details of the combined channel stop and drain regions.

Attention is now directed to FIG. 2, which provides an expanded view of a portion of the imager shown in FIG. 1. In this figure, an individual pixel 90 of a vertical shift register is highlighted. The pixel is composed of two phases, each with a storage region 110 and a transfer region 120. The transfer regions are fashioned from the storage regions by compensating the n-type buried channels with p-type impurities. In depletion mode (or with 0 Volts on the polysilicon gate) the channel potential in the storage region 110 is typically designed to be approximately 8 volts, while the channel potential in the transfer region 120 is set to approximately 3 Volts. In accumulation mode (or with −10 Volts on the polysilicon gate) the channel potential in the storage region 110 is typically designed to be approximately 2 Volts, while the channel potential in transfer region 120 is set to approximately 0 Volts.

During integration mode, electrons are created by photo-generation in the substrate 10, and are collected into the storage regions 110 of the buried channel CCD devices 20. By means of the punch-through effect, to be described in detail shortly, excess charge generated in the pixel is discharged from the storage regions into the highly doped n-type drain regions 130 that lie adjacent the buried channel CCD devices 20. The drain regions are actually located below the heavily-doped p-type Surface Accumulatingregions 30, or channel stops, that isolate the individual columns of buried channel CCD devices. The channel stops also serve to isolate the electrons in the drain from the semiconductor surface. Also below the channel stop 30, surrounding the drain region 130 and serving to isolate the drain 130 from the buried channel CCDs 20 and the semiconductor substrate, is another p-type region, known as the drain-encapsulating region 140. The discharge of the electron charge from the buried channel CCDs 20, is enabled by applying a small voltage to the drain 130 such that the p-type drain-encapsulating regions 140, separating the n-type buried channel storage regions 110 from the n-type drain 130, are electrostatically penetrated. (A more complete view of region 140 is included in FIG. 3).

Lines representing two cross-sectional views, A–A' and B–B', are also indicated in FIG. 2 and form the basis for the detailed numerical studies of the impurity distributions and electrostatic potential calculations in the discussion that follows. Line A–A' corresponds to the path of discharge for an electron from the storage region 110 of the buried channel CCD to the drain 130, while line B–B' corresponds to the path of discharge for an electron from the transfer region 120 of the buried channel CCD to the drain 130.

Figure 3:
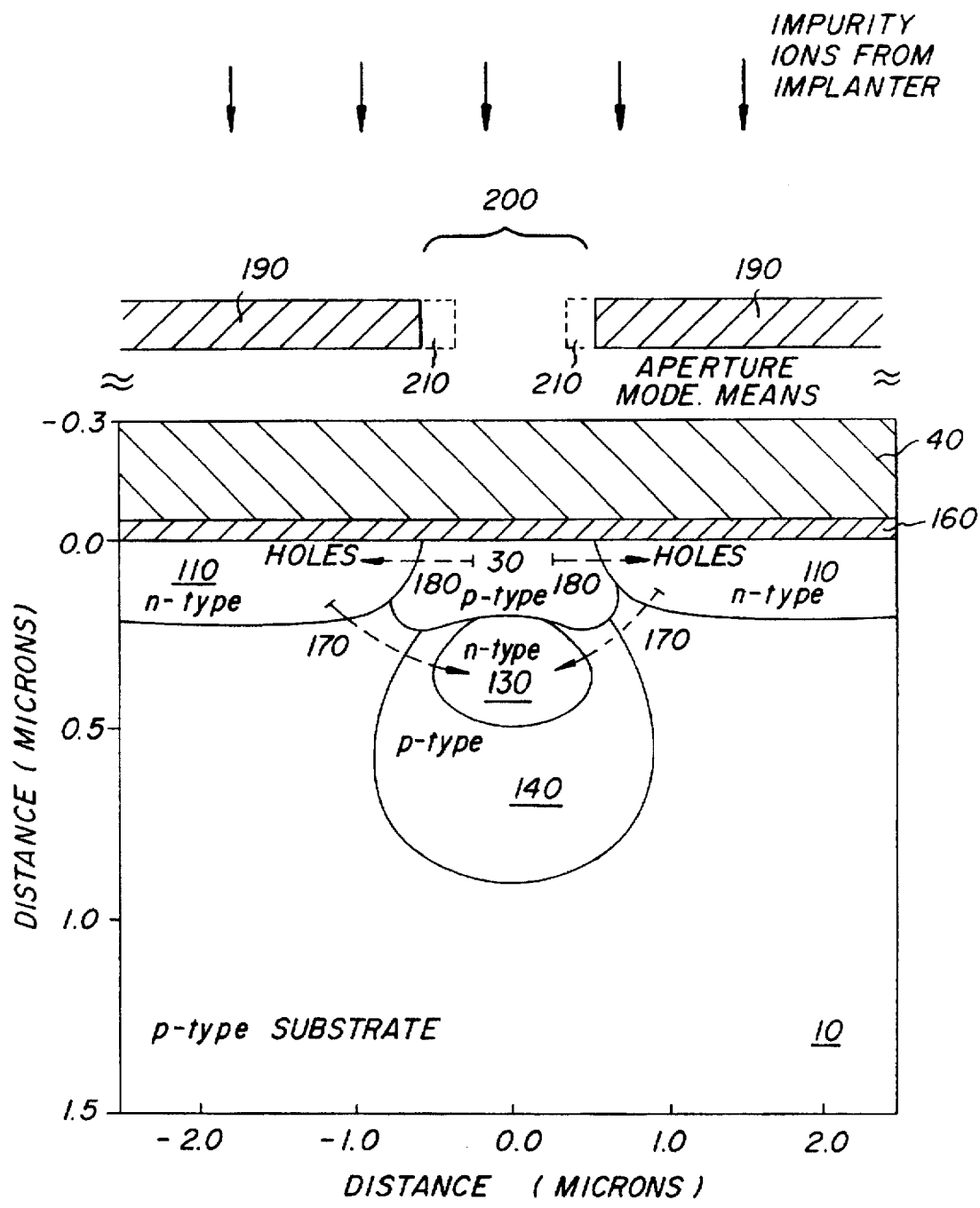
FIG. 3 provides a cross-sectional view corresponding to line A–A' in FIG. 2.

In FIG. 3, the cross-sectional view of the structure corresponding to line A–A' as depicted in FIG. 2. In the p-type substrate 10, the n-type drain region 130 is shown, positioned below the p-type Surface-Accumulatingregion 30 (or channel stop), and surrounded by the p-type impurities of the drain-encapsulating region 140. A single mask opening 200 allows for self-alignment of the drain 130, drain-encapsulating 140, and Surface-Accumulatingimplants 30 to the buried channel CCD; although, by methods described in the text, the mask opening can be uniformly narrowed on both sides to allow the drain implant to be inset a small fixed distance with respect to the drain-encapsulating and the Surface-Accumulatingimplants. Also shown in the figure are the path of discharge for an electron from the storage region 110 of the n-type buried channel CCDs to the drain 130, and the path of supply for holes from the channel stop region 30 to the surface of the buried channel CCDs 30;

Calculations of the material boundaries and representative contours of constant doping concentration, delineating the extent of the various implanted semiconductor regions, were obtained using the process model for semiconductor devices in two dimensions. On the surface of the p-type substrate 10 is shown the channel stop region 30, centered between the n-type buried channel CCD storage regions 110 of two adjacent columns. Below the channel stop is located the heavily-doped n-type drain 130. The drain-encapsulating region 140, initially described in FIG. 2, is now more clearly shown. Region 140 is a heavily doped p-type region enclosing the heavily doped n-type drain so that the drain is surrounded in all radial directions by p-type impurities. An insulating layer of gate oxide 160, with a typical thickness of 500 A, covers the semiconductor surface.

Also appearing in FIG. 3 is a set of dashed lines 170 illustrating the path of electron discharge from the buried channel CCD storage regions 110 to the drain 130. Another set of dashed lines 180 show the supply path for majority carrier holes from the channel stop regions 30 to the buried channel CCD storage regions, when the device is operated in the accumulation mode. As mentioned earlier, accumulation mode operation is invoked by the application of a large negative voltage to the polysilicon electrode 40, and occurs during the charge integration period.

Figure 4A:
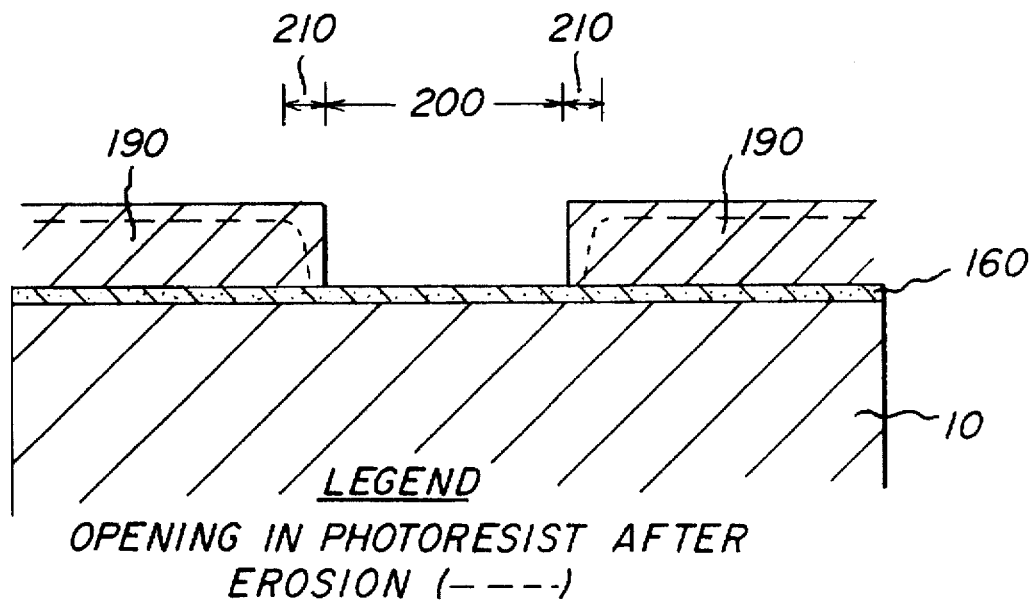
FIG. 4(a) illustrates chemical erosion of the used for the Drain-Encapsulating Implant.
Figure 4B:
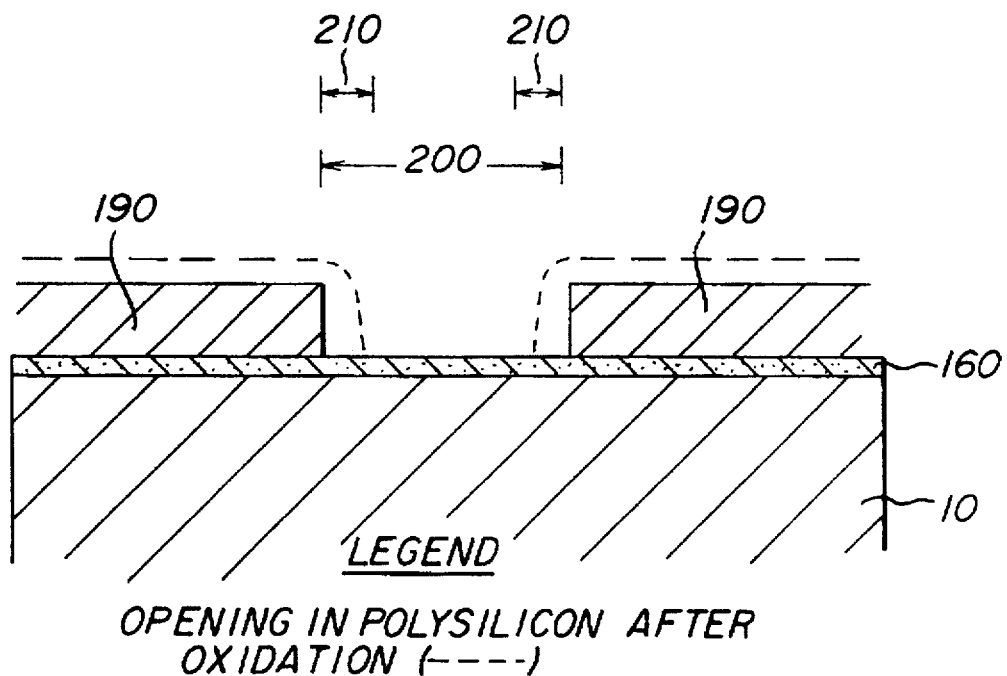
FIG. 4(b) illustrates the oxidation of the polysilicon is used to decrease the width of the mask opening for the Drain Implant.

Just above the polysilicon electrode 40, a mask 190 used for the selective introduction of impurities into the substrate 10 is schematically represented. The mask provides a opening 200, with a representative width of 1.0 micron, through which the drain implant forming region 130, the Surface-Accumulatingimplant forming region 30, and the drain-encapsulating implant forming region 140, are all introduced. To provide greater restraint on the lateral extent of the Drain Implant, special lithographical procedures may be employed to modify the nominal width of the mask opening 200 by a small amount 210 on each side. One simple scheme to achieve a small increase in the width of the mask opening would be to subject the mask opening, defined in a layer of photoresist, to a slight erosion by chemical means, as illustrated in FIG. 4(a). A scheme, to achieve a small decrease in the width of the mask opening, would be to subject the mask opening, defined in a layer of polysilicon, to a short oxidation cycle, as illustrated in FIG. 4(b). Of course, an additional advantage of this second method is that boron introduced by the drain-encapsulating implant through the patterned opening in the polysilicon will undergo lateral diffusion during the polysilicon oxidation step. This lateral diffusion of the boron occurs in a manner so as to provide enhanced containment of the Drain Implant, implanted through the same opening in the polysilicon after removal of the imager wafer from furnace.

As a final comment on FIG. 3, it is noted that the n-type buried channel implant forming region 110, introduced uniformly over the entire surface of the substrate in a previous step, is effectively interrupted in the channel stop region 30 by the overwhelming levels of p-type compensation. In this way, self-alignment of the buried channel region to the channel stop region is realized in the structure.

The cross-sectional view corresponding to line B–B' is similar to the one presented in FIG. 3, with the only exception being that the n-type buried channels of the CCD are compensated by p-type Boron impurities to form the transfer regions. The uncompensated buried channel regions, or storage regions, alternate with the compensated regions, or transfer regions, to produce a buried channel CCD shift register with the property of uni-directional transfer.

Two specific examples examined with the assistance of process and device simulation are now presented to illustrate in detail the operational aspects of the Compact Isolation and Antiblooming (CIA) Structure, described in this application. The first example describes a design for the CIA structure in which the drain is composed of phosphorus impurities, while the second example describes a design in which the drain is composed of arsenic impurities.

Figure 5:
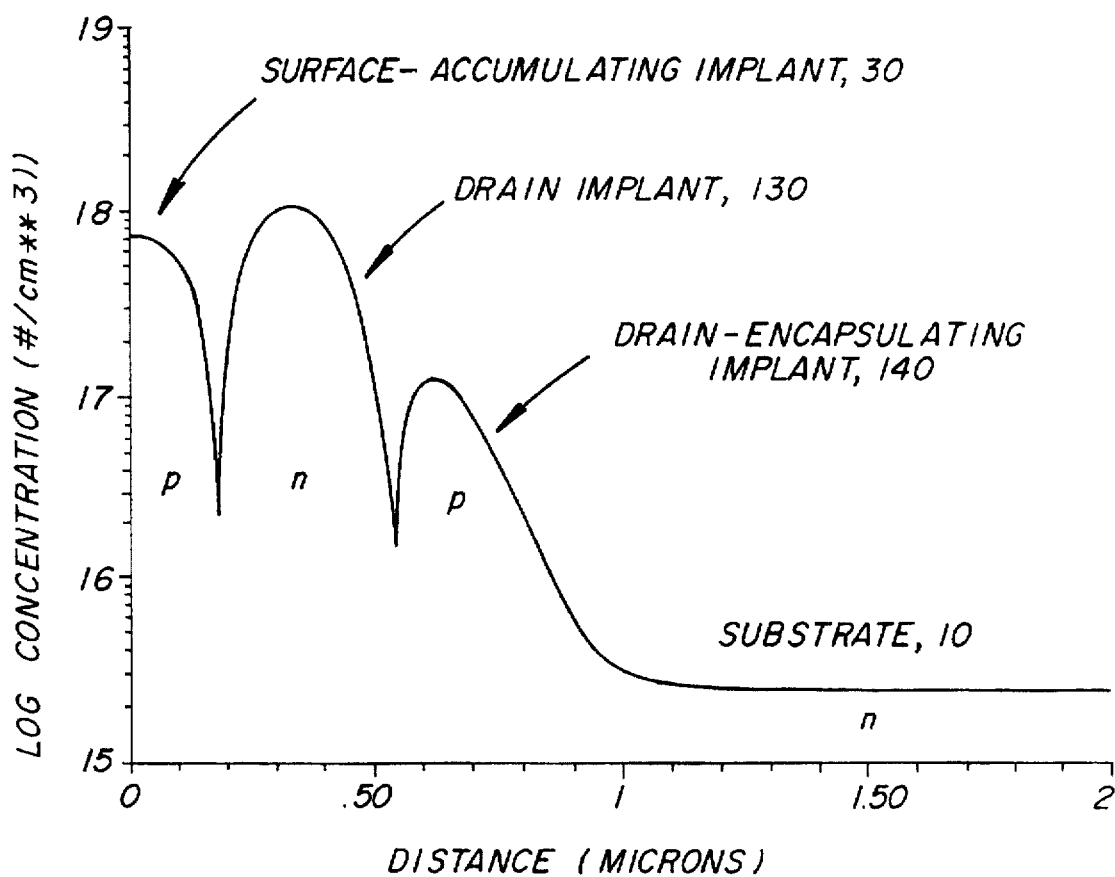
FIG. 5 shows the vertical doping profile corresponding to x=0 in FIG. 3, for an example case in which Phosphorus impurities have been selected for the drain implantation.

Referring now to FIG. 5 which is an ion concentration chart of the preferred embodiment of the invention employing a phosphorus implanted drain in the structure shown in FIG. 3, the following fabrication sequence has been chosen. First, the silicon substrate is prepared with a p-type doping level of $2.5 \times 10^{15}$ cm$^{-3}$. Next, a gate oxide 160 is grown uniformly over the substrate surface to a thickness of 500 Å. The buried channel implant, consisting of arsenic ions with a dosage of $3.15 \times 10^{12}$ cm$^{-2}$ and with an energy of 175 KeV, is introduced uniformly into the structure, creating an n-type buried channel with a junction depth of approximately 0.2 microns. The Surface-Accumulatingimplant, consisting of boron ions with a dosage of $4.0 \times 10^{13}$ cm$^{-2}$ and with an energy of 50 KeV, and the drain-encapsulating implant, consisting of boron ions with a dosage of $1.4 \times 10^{13}$ cm$^{-2}$ and with an energy of 200 KeV, are then introduced through an opening 200 in the mask 190 measuring 0.6 microns in width. The Drain Implant, consisting of Phosphorus Ions with a dosage of $6.0 \times 10^{13}$ cm$^{-2}$ and with an energy of 250 KeV, is then introduced into the same opening, but only after a technique such as the one illustrated in FIG. 4(b) has been used to effectively reduce the mask opening by 0.1 micron on each side. Conversely, the mask opening can be increased in size using the technique illustrated in FIG. 4(a), though now requiring that the Drain Implant precede the Surface-Accumulating and Drain-Encapsulating implants. (To form the transfer region of the CCD, a p-type Boron implant is used to compensate the Buried Channel Implant, with a typical dosage of $1.9 \times 10^{12}$ cm$^{-2}$ at 150 KeV.) To complete the process, oxidation and annealing steps totaling about 175 minutes at 950° C. are included in the simulation to produce the final dopant distributions.

A plot of the vertical doping distribution produced by the above process, corresponding to x=0.0 in FIG. 3, is shown in FIG. 5. The Surface-Accumulating Implant, Drain Implant, and Drain-Encapsulating Implants are all clearly visible, with the peaks of these implants occurring at 0.0, 0.35, and 0.60 microns, respectively, relative to the semiconductor surface.

Figure 6A:
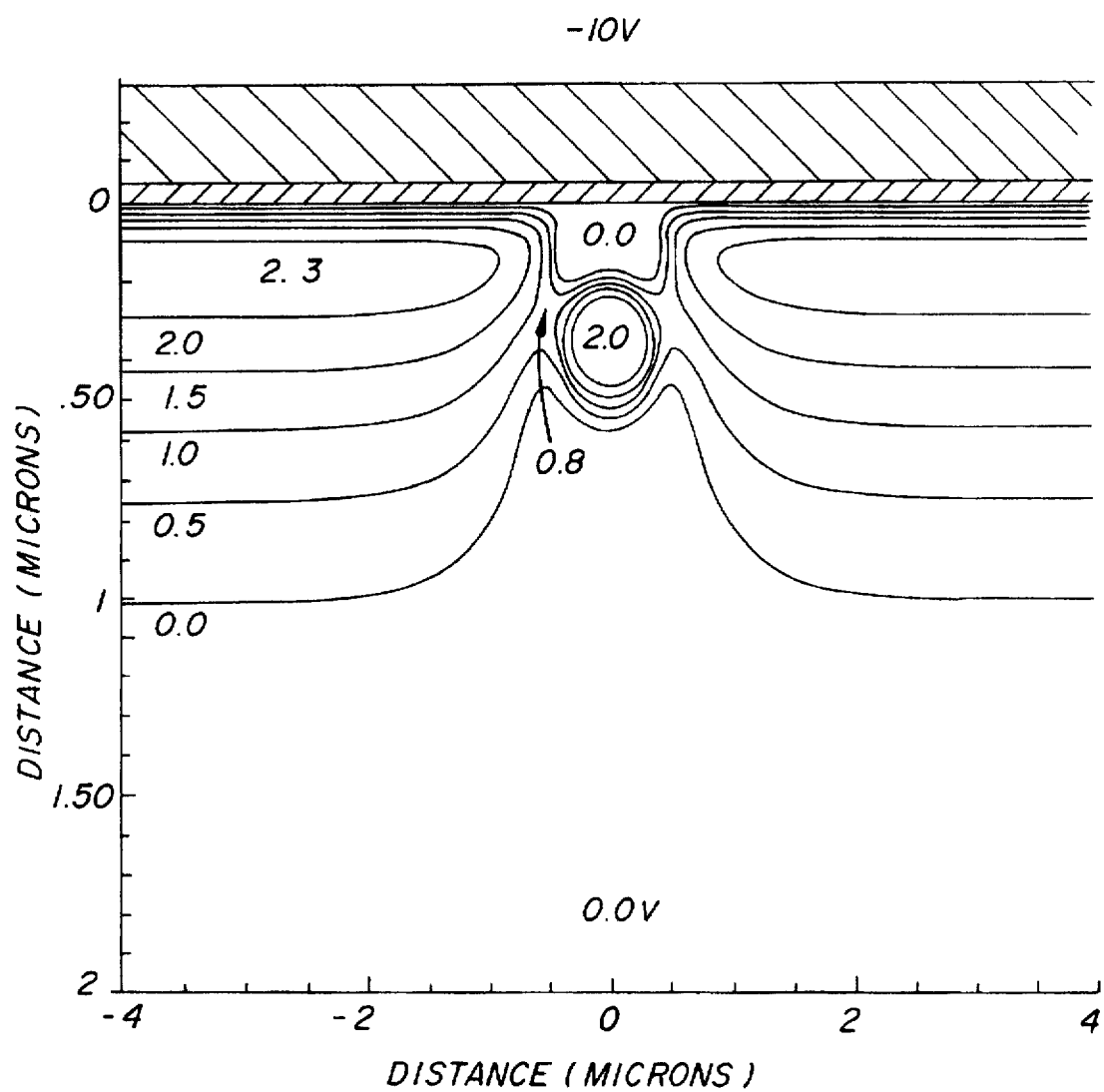
FIG. 6(a) illustrates the operation of the overflow mechanism for the structure shown in FIG. 3.
Figure 6B:
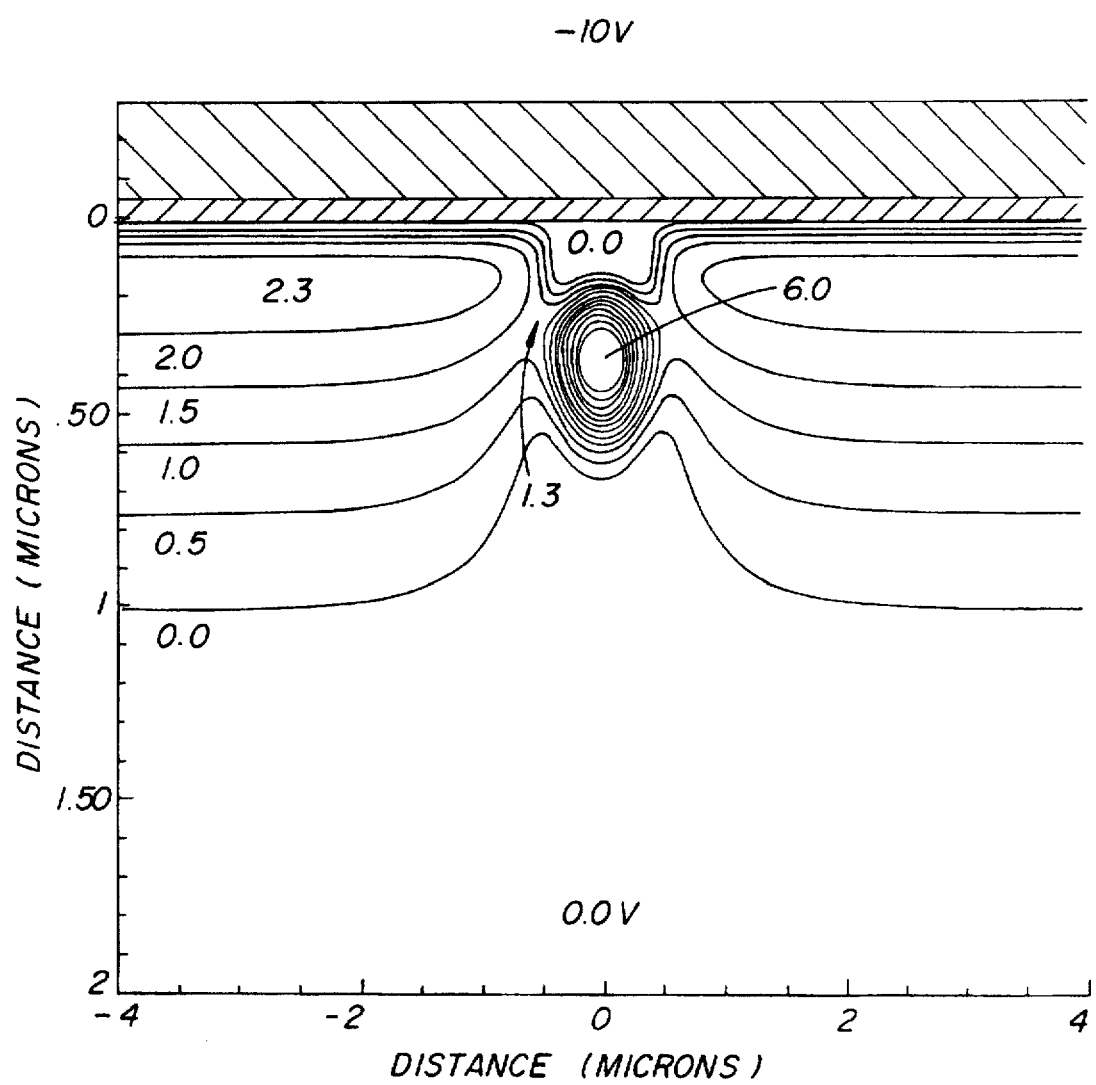
FIG. 6(b) illustrates control of overflow by electronically adjusting the drain bias.
Figure 6C:
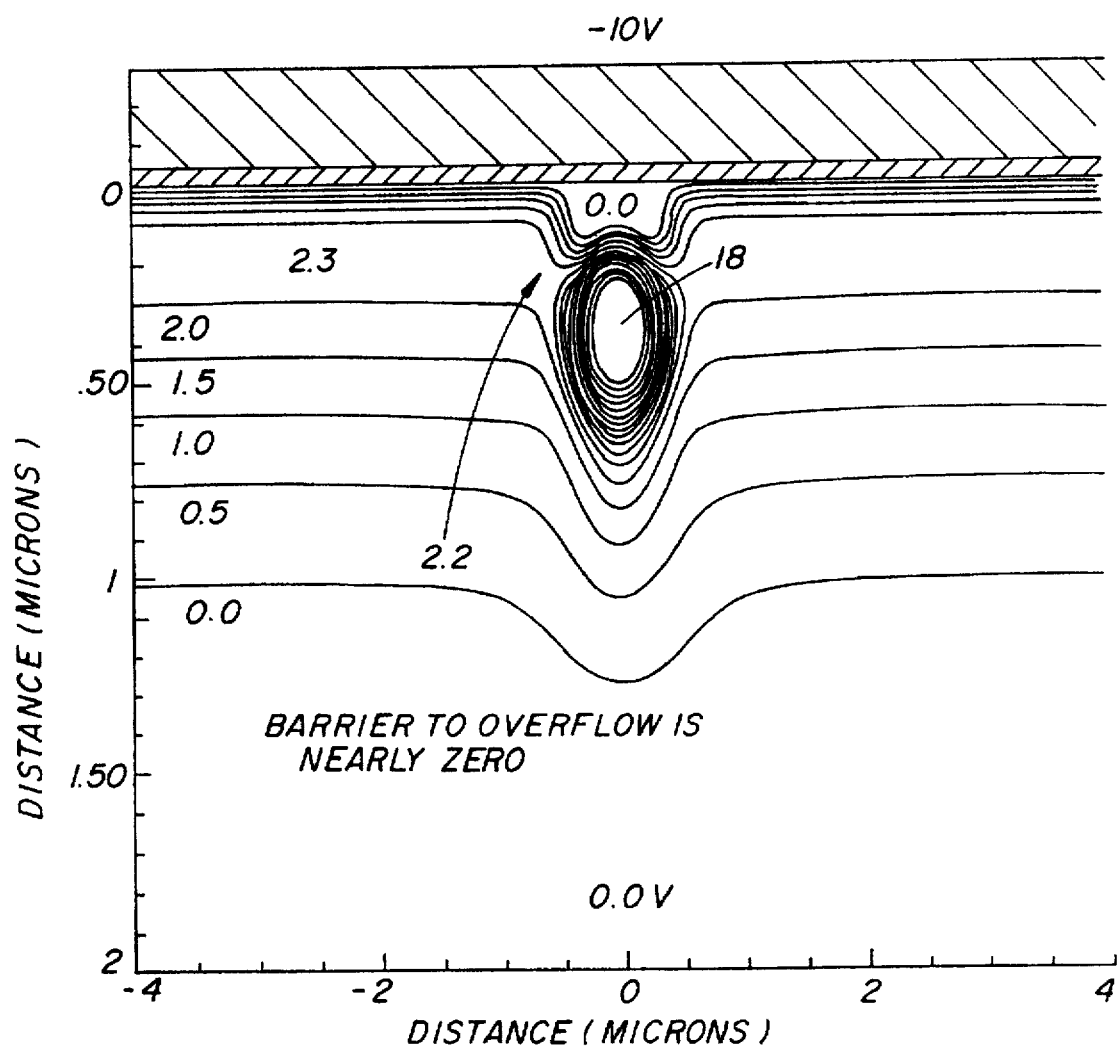
FIG. 6 (c) illustrates the emptying of charge from the buried channel region.

FIGS. 6(a)–6(c) show contours of constant electrostatic potential for the cross-sectional view corresponding to line A–A' in FIG. 2 for an example case in which Phosphorus impurities have been selected for the drain implantation. The analysis illustrates the operation in the accumulation mode (−10 Volts on the gate electrode) for drain voltage settings at 2, 6, and 18 Volts, respectively.

FIG. 6(a) illustrates the operation of the charge overflow mechanism for the structure drawn in FIG. 3, when Phosphorus is used to create drain 130 as shown in FIG. 5. FIG. 6(a) illustrates contours of the constant electrostatic potential. These contours are obtained from a simulation of the Poisson's equation for semiconductor devices in two-dimensions. The simulation shown in FIG. 6a has the device biased in the accumulation mode; that is, a large negative bias (−10 Volts, in this example) applied to the polysilicon electrode 40 of FIG. 3, while the substrate 10 and the Surface-Accumulatingregion 30 (or channel stop) are held at 0 Volts. It should be understood to those skilled in the art that the surface-accumulating region can be biased separately from the substrate by including the appropriate circuitry, typically at the periphery of the imager. Meanwhile, the buried channel regions 110 are fully depleted by setting the electron Fermi level to a large positive value (20 Volts, for instance). As can be seen in FIG. 6(a), the channel potential in the buried channel regions is 2.3 Volts in the accumulation mode. The drain region is biased to 2 Volts and remains highly conductive due to the high n-type dopant concentration. Examining the path corresponding to the dashed lines 170 in FIG. 3, it is found that if a small number of electrons were to be introduced into the buried channel region 20, these electrons would be completely isolated from the electron Fermi sea, positioned at 2 Volts in the drain, by an electrostatic barrier produced by the presence of the p-type impurities in region 140. Isolation from the drain would be maintained as the electron Fermi level in the buried channel region is increased, until a level of about 0.8 Volts is reached. Beyond this point, the excess charge would spill into the drain. In conclusion, it is demonstrated that a signal packet of about 1.5 Volts of electron charge can be stored in the buried channels during charge integration before spill-over into the drain occurs.

As FIG. 6(b) illustrates, the point of overflow can be controlled electronically by adjusting the drain bias. When 6 Volts are applied to the drain, the point of overflow occurs at 1.3 Volts. In this case, the signal packet stored in the buried channels would be reduced to 1.0 Volts of electron charge. Finally, by applying a large enough bias to the drain, it is possible to empty the buried channel region almost entirely of charge, as illustrated in FIG. 6(c) where 18 Volts is applied to the drain. (Later it will be shown that the doping level and cross-sectional area of the drain set a limit on the maximum voltage that can be applied to the drain, due to the effects of depletion.)

From FIGS. 6(a)–6(c), it is clear that a supply of majority carrier holes from the channel stop region to the buried channels during accumulation mode operation, along the path described by lines 180 in FIG. 3, is always readily available. Indeed, the surface-accumulating region 30 is never depleted of holes, even in the case of 18 Volts applied to the drain. This fact can be substantiated by observing that the surface-accumulating region in all cases remains at 0 Volts.

Figure 7A:
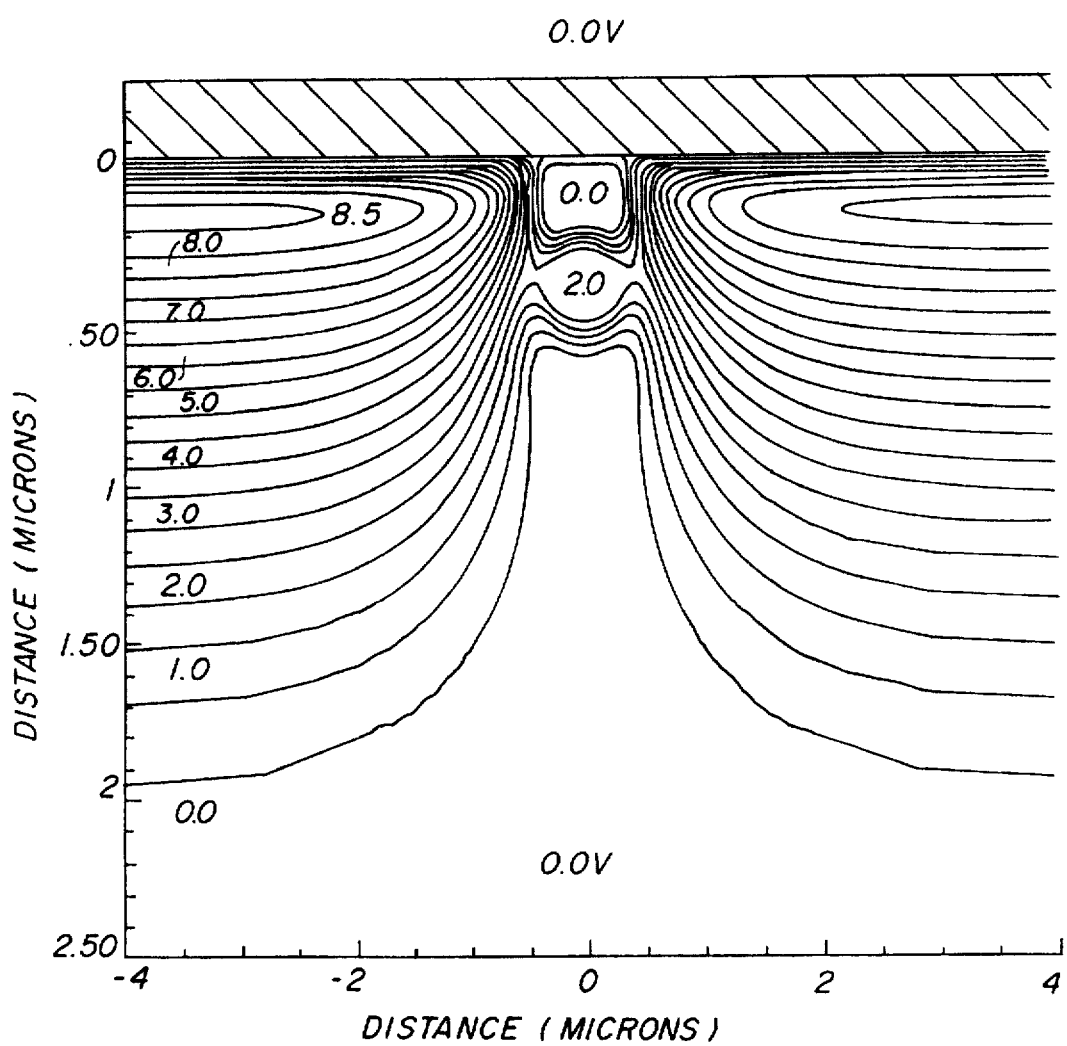
FIG. 7(a) show contours of constant electrostatic potential corresponding to line A–A' in FIG. 2 for drain voltage settings at 2 volts.
Figure 7B:
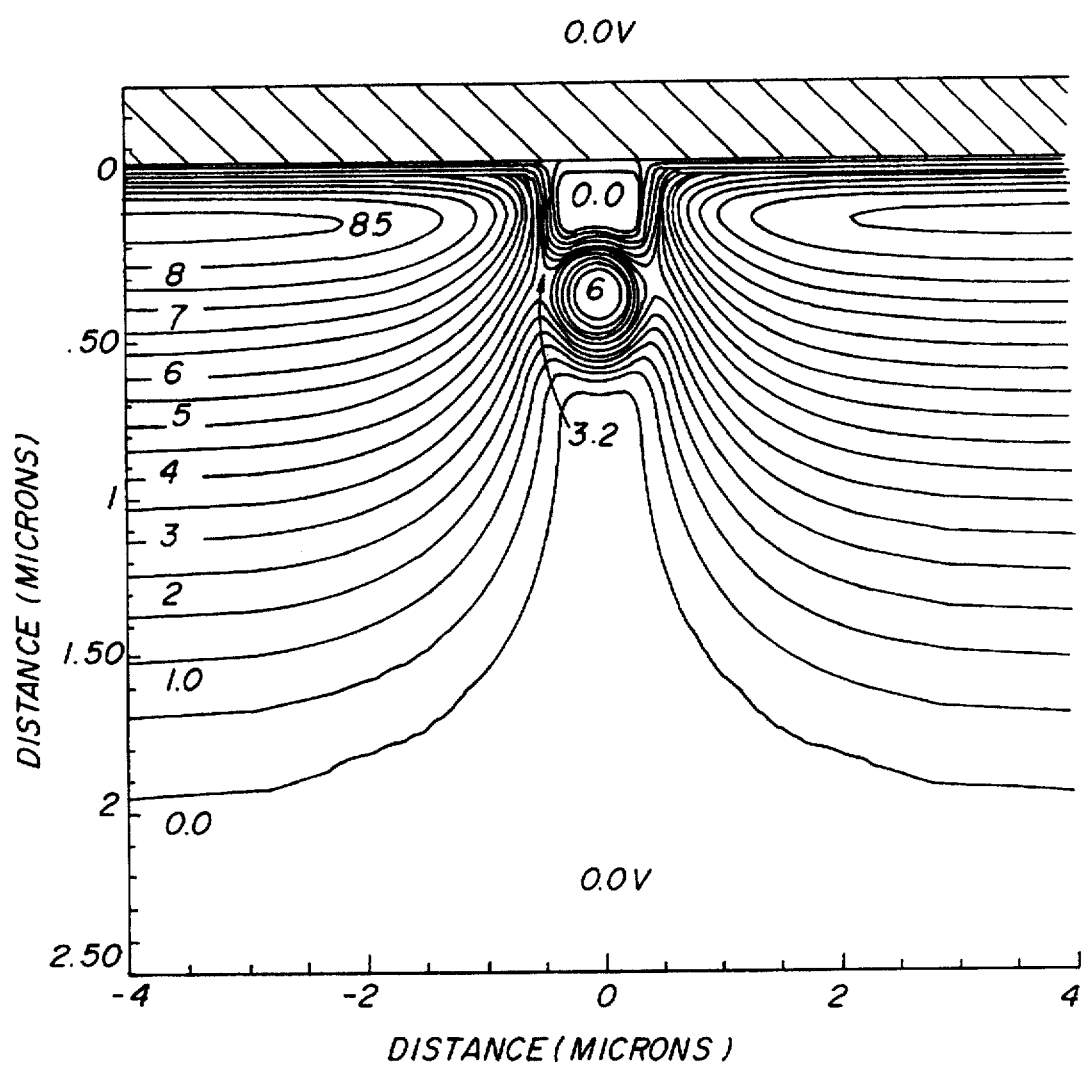
FIG. 7(b) show contours of constant electrostatic potential corresponding to line A–A' in FIG. 2 for drain voltage settings at 6 volts.
Figure 7C:
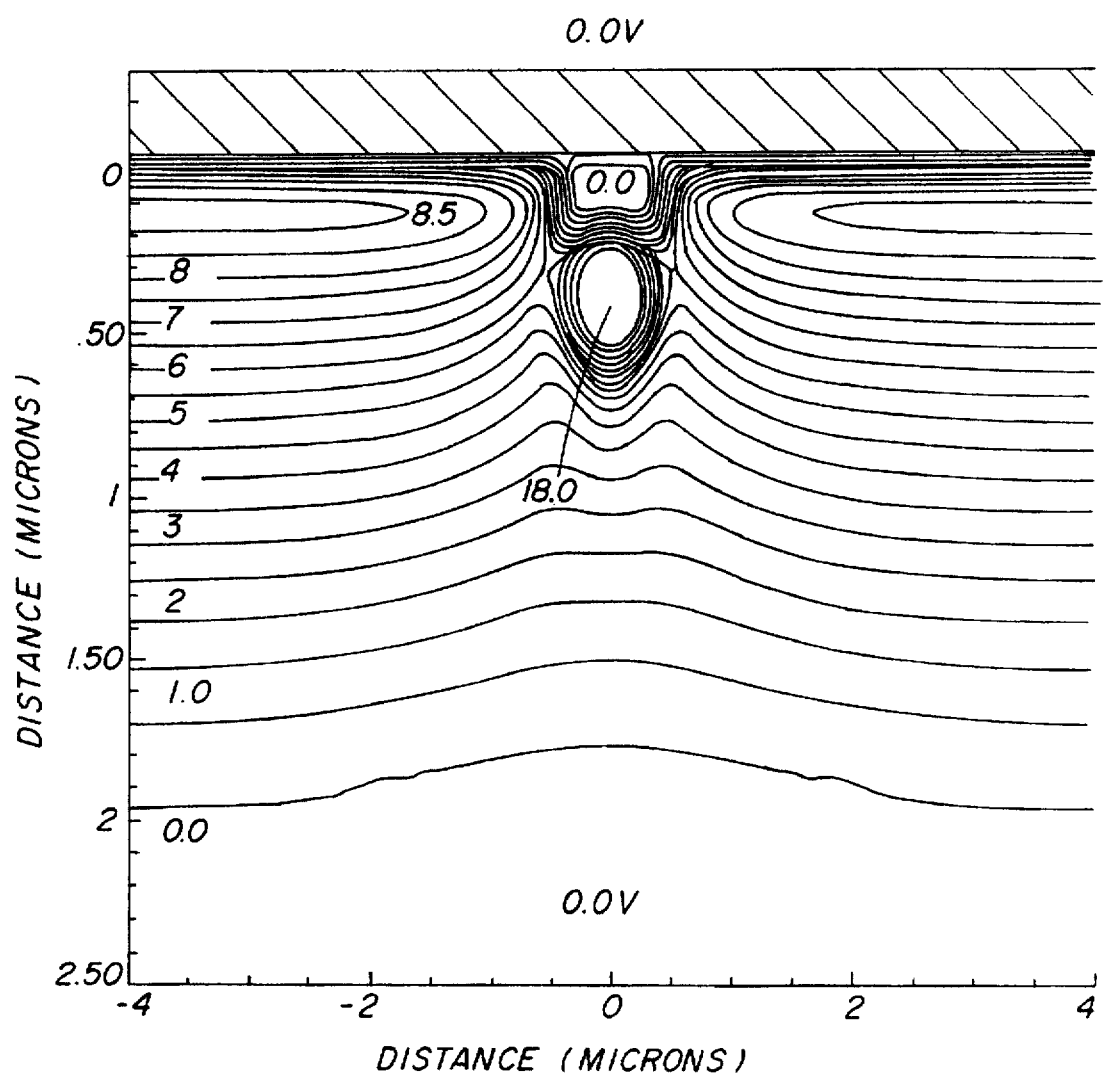
FIG. 7(c) show contours of constant electrostatic potential corresponding to line A–A' in FIG. 2 for drain voltage settings at 18 volts.

After the charge integration period is completed, it is necessary to apply a sequence of clock voltages to the polysilicon gates 40 and 50 that alternate between the accumulation mode (−10 Volts on the gate) and the depletion mode (0 Volts on the gate) in order to transfer charge down the vertical shift registers 20 and into the horizontal shift register 70, as shown in FIG. 2. It is therefore important to examine the charge containment properties for the buried channels while in the depletion mode. FIGS. 7(a)–7(c) present contours for the electrostatic potential in the depletion mode, for a series of drain voltages corresponding to those used in FIGS. 6(a)–6(c).

FIGS. 7(a)–7(c) show contours of constant electrostatic potential for the cross-sectional view corresponding to line A–A' in FIG. 2 for an example case in which Phosphorus impurities have been selected for the drain implantation. The analysis illustrates the operation in the depletion mode (0 Volts on the gate electrode) for drain voltage settings at 2, 6, and 18 Volts;

As we shall now see, selection of the drain bias is critical to proper operation of the structure, especially in the depletion mode. Obviously, electron charge must not be lost to the overflow drain while in depletion mode, nor must electron charge be inadvertently introduced from the overflow drain to the buried channels. In FIG. 7(a), for example, with 0 Volts applied to the gate, it is observed that a 2 Volt setting on the drain does not provide sufficient isolation of the electron Fermi sea in the drain from electrons in the buried channel regions. Electrons would actually surmount the small potential barrier and flow directly from the drain into the buried channels, eventually raising the Fermi level in the buried channels to a level comparable to that in the drain. However, when the drain is set to 6 Volts, as shown in FIG. 7(b), the electron charges in the drain and in the buried channel are again fully isolated from each other. From the figure, it is seen that the channel potential at the point of overflow from the storage region to the drain is 3.2 Volts. This voltage setting on the drain is representative of many voltage settings in the vicinity of 6 Volts that will simultaneously satisfy the requirements of precise overflow control in the accumulation mode and isolation of the drain and buried channel regions in the depletion mode. FIG. 7(c) indicates that for even larger voltages (18 Volts) on the drain, excellent isolation of the drain and buried channel regions is maintained. The results presented in FIGS. 6(c) and 7(c) also demonstrate that the discharge of electrons from the buried channel regions into the drain is more readily accomplished while in the accumulation mode.

Figure 8A:
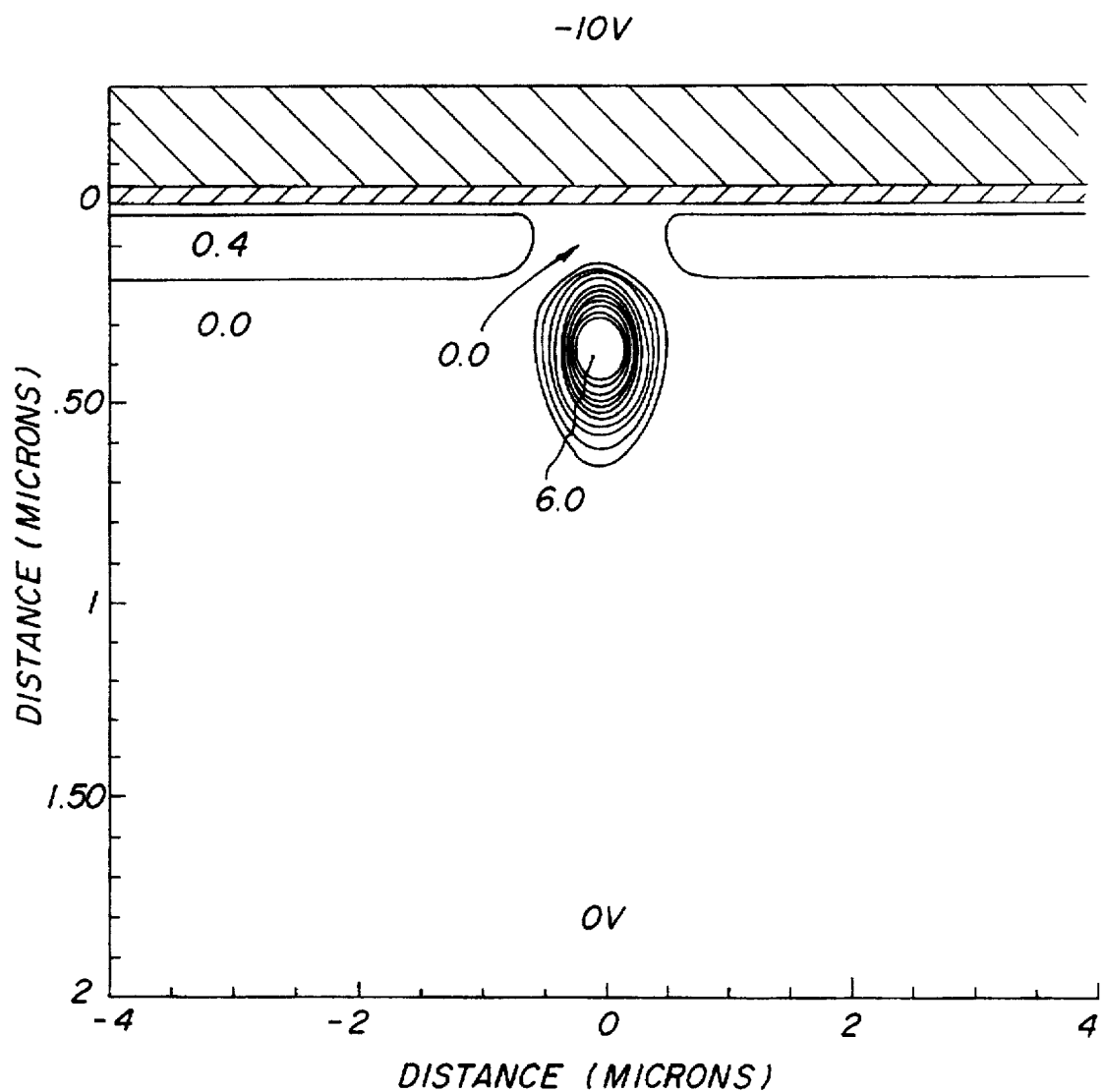
FIG. 8(a) shows contours of constant electrostatic potential for the cross-sectional view corresponding to line B–B' in FIG. 2 in the accumulation mode wherein −10 Volts is on the gate.
Figure 8B:
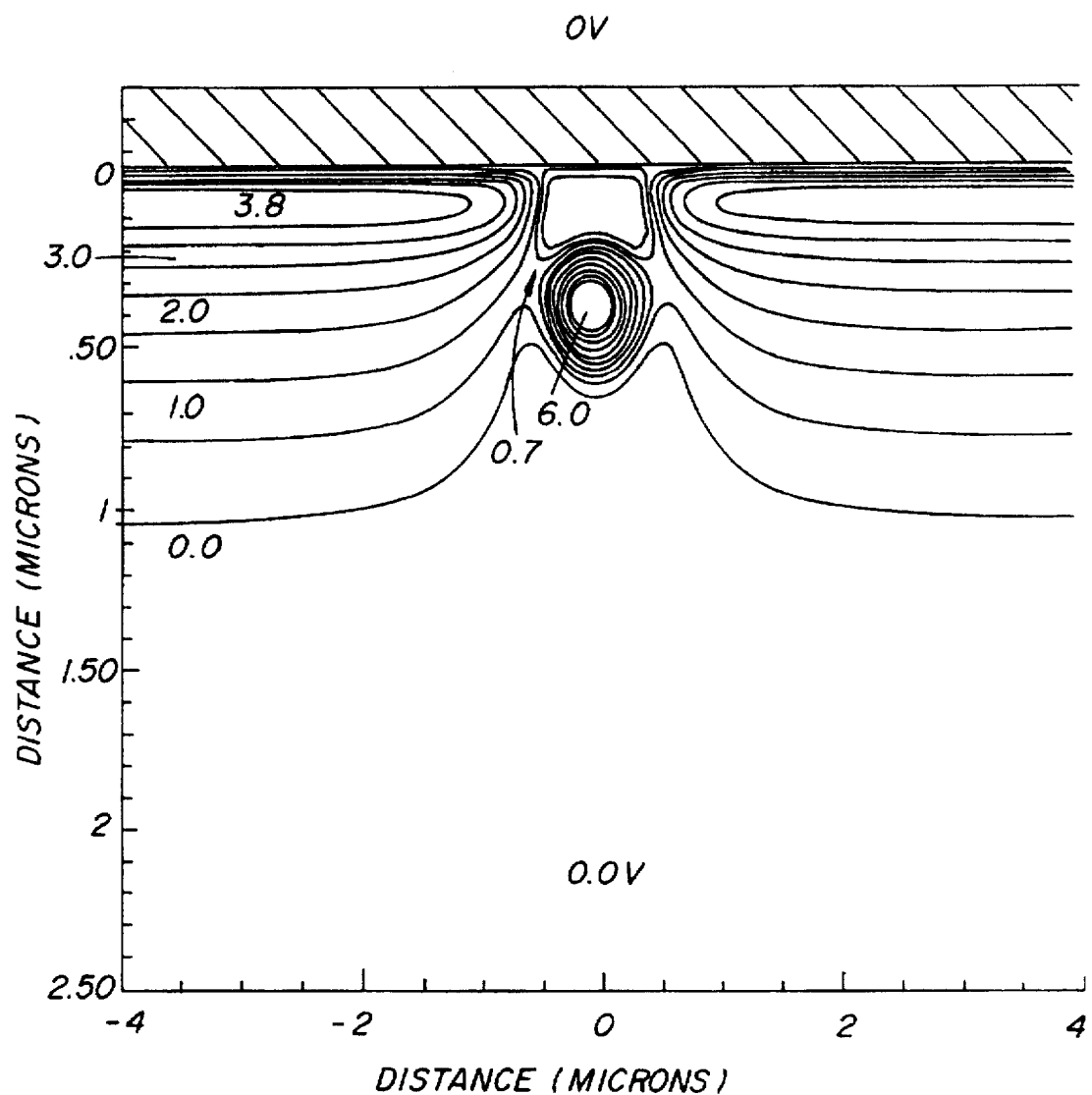
FIG. 8(b) shows contours of constant electrostatic potential for the cross-sectional view corresponding to line B–B' in FIG. 2 in the depletion mode wherein drain voltage setting is 6 Volts.

FIGS. 8(a) and 8(b) show contours of constant electrostatic potential for the cross-sectional view corresponding to line B–B' in FIG. 2 for the example case in which Phosphorus impurities have been selected for the drain implantation. It is important to examine the operational aspects of the overflow drain along the line B–B' representing the transfer region of the device for the purpose of understanding the entire device performance. FIG. 8(a) shows that the channel potential in the transfer region is 0.4 Volts and, for operation in the accumulation mode (−10 Volts on the gate) and with the drain set to 6 Volts, the potential at the point of overflow from the transfer region to the drain is very close to 0 Volts. FIG. 8(b) illustrates operation in the depletion mode with 0 Volts on the gate and the drain 130 set to 6 Volts, the channel potential in the transfer region is 3.8 Volts and the potential at the point of overflow from the transfer region to the drain is 0.7 Volt.

Figure 9A:
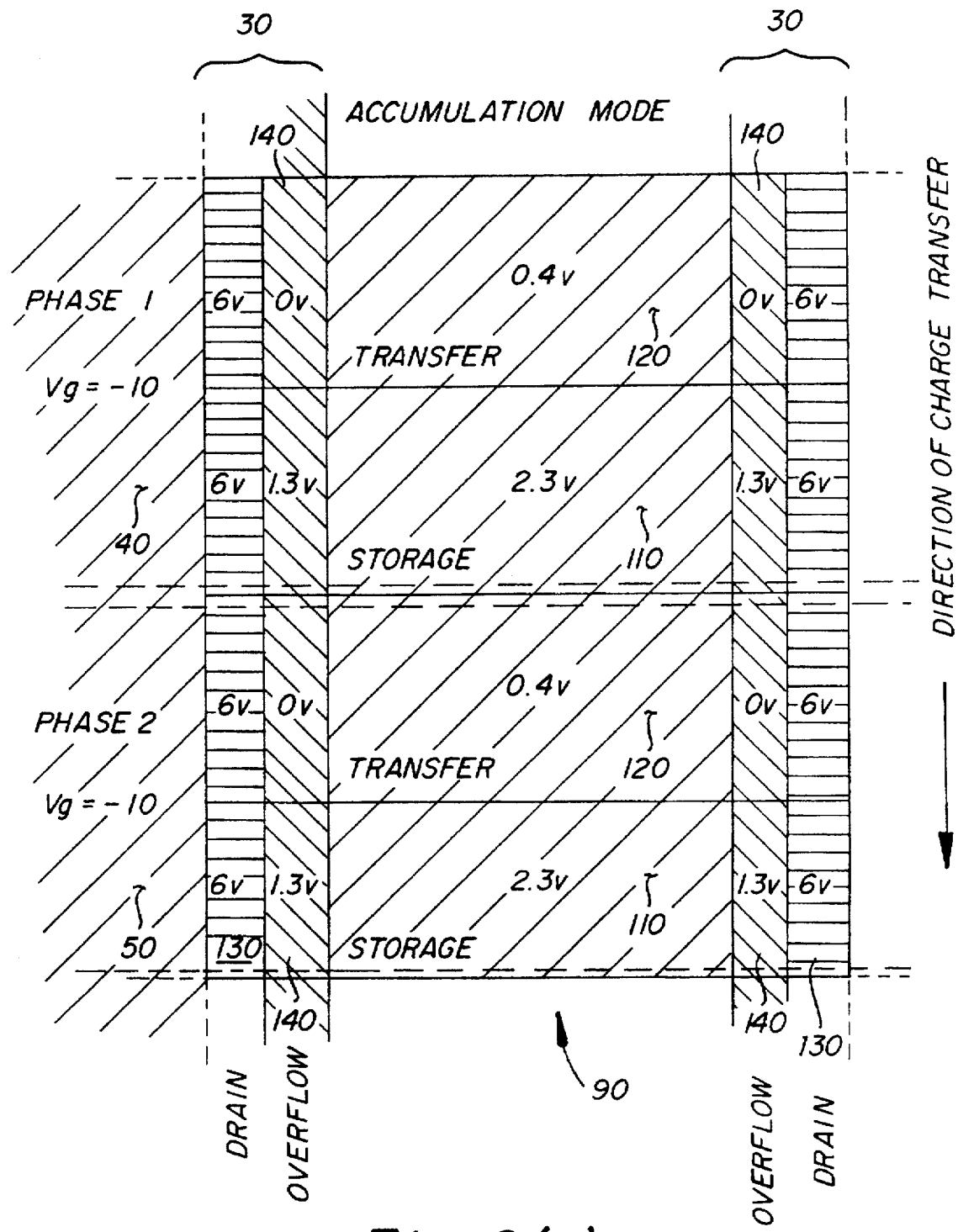
FIG. 9(a) provides a summary of the channel potentials in the accumulation mode.
Figure 9B:
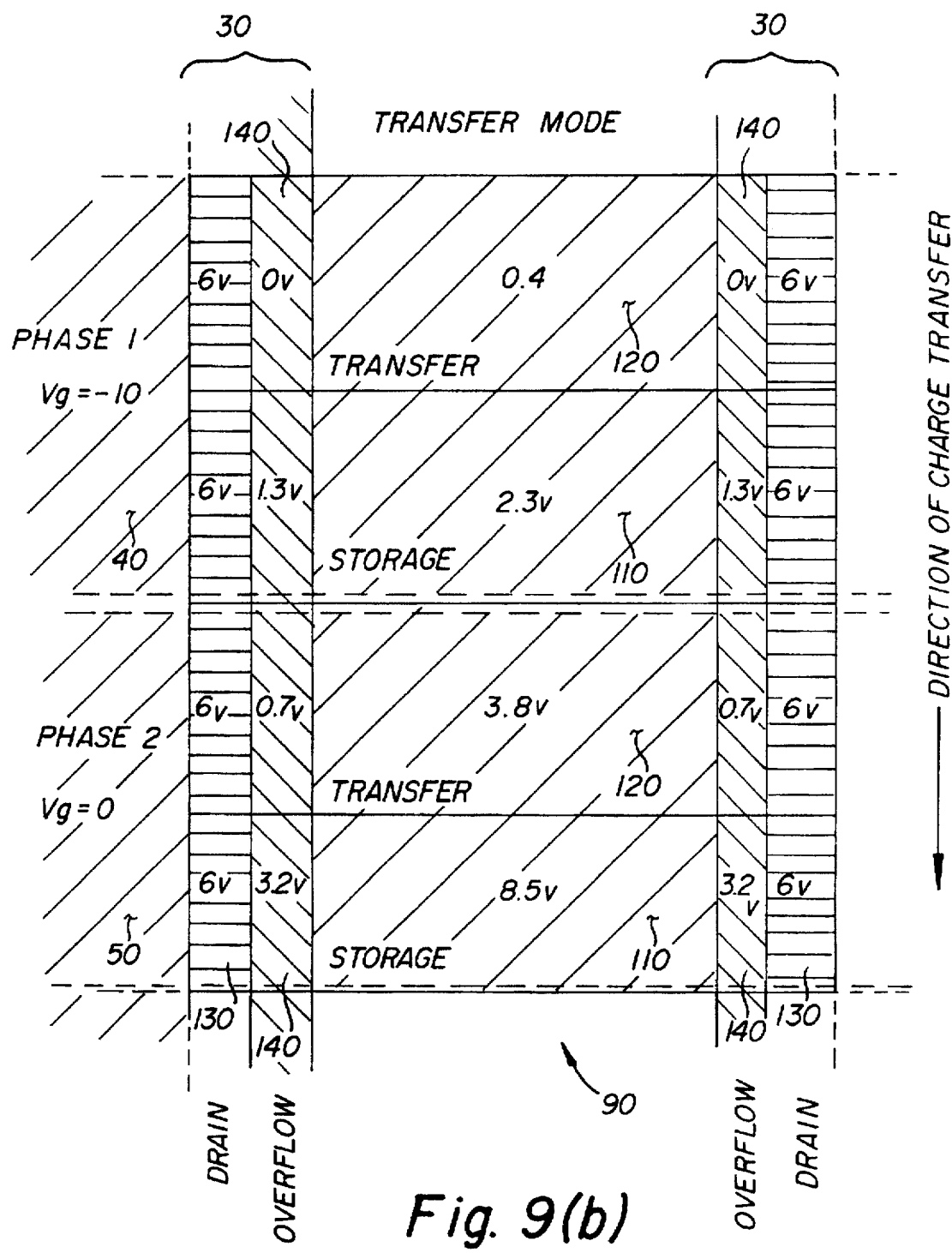
FIG. 9(b) provides a summary of the channel potentials in the charge transfer mode.

FIGS. 9(a) and 9(b) provide a summary of the channel potentials in the accumulation and transfer modes, respectively, for the example case in which Phosphorus impurities have been selected for the drain implantation. In order to transfer charge without spill-over into the drain, it is extremely crucial that the potential of the overflow barrier in the transfer region be near 0 Volts in the accumulation mode; and, in the depletion mode, at a potential value less than the accumulated storage potential of the preceding phase. That these requirements are met can be verified by inspecting FIGS. 9(a) and 9(b) in which the channel potentials in two adjacent phases are shown for the charge accumulation and charge transfer modes, respectively. FIGS. 9(a) and 9(b) serve to summarize the principal results collected thus far.

Note that, in the case of the charge accumulation mode, charge is collected into the storage regions of the buried channel devices, with overflow not occurring until the design level, 1.3 Volts, is reached. In the charge transfer mode, it is observed that charge passing through the transfer region will remain in the buried channels, without spilling over unintendedly into the drain. It is clear that the storage regions in depletion mode have the capacity to store all of the charge integrated during the accumulation mode, without overflow to the drain.

Figure 10:
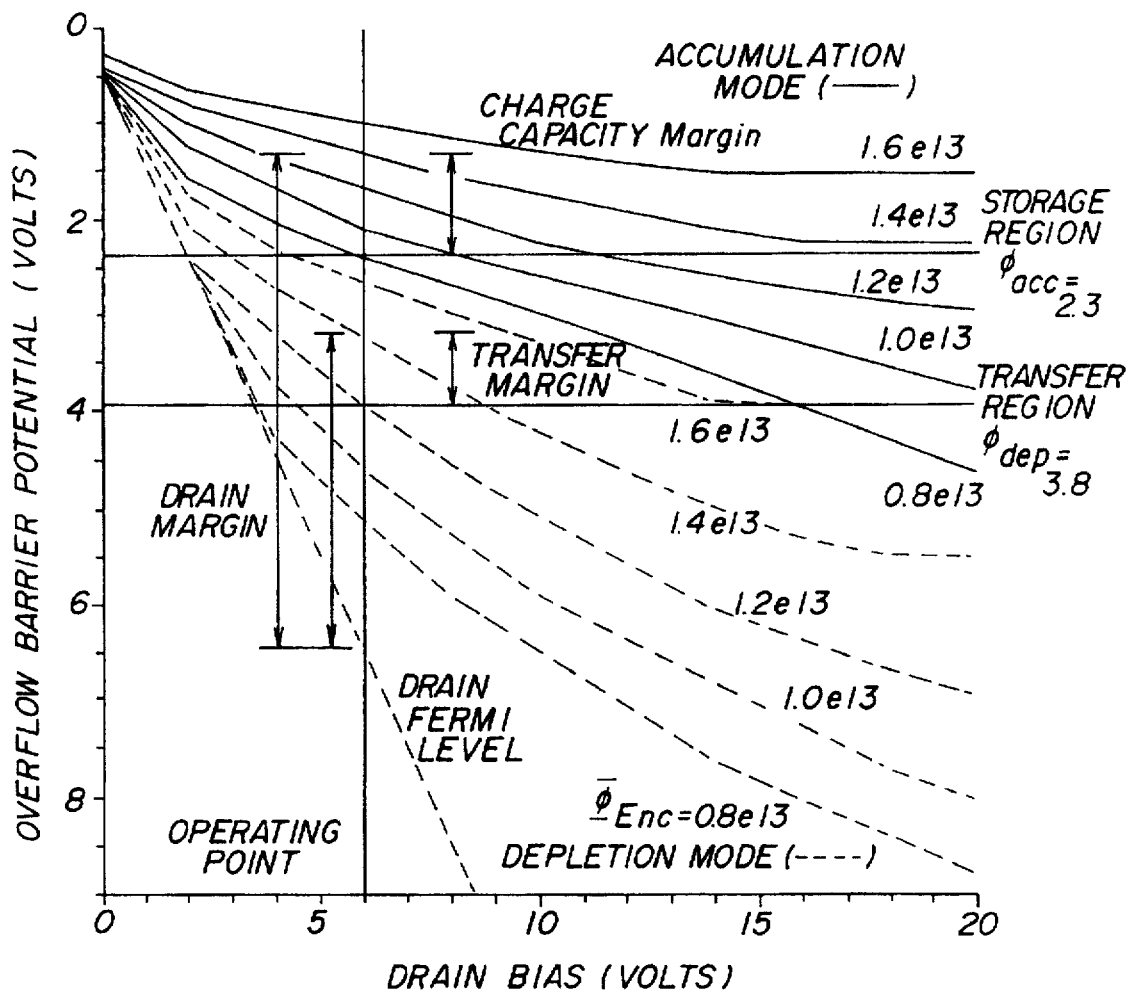
FIG. 10 plots the channel potential at the point of charge overflow from the storage region to the drain in both the accumulation and depletion modes as a function of applied drain voltage, with the dosage of the Drain-Encapsulating Implant as a parameter.

By adjusting the dosage of the Drain-Encapsulating Implant, the potential at the point of charge overflow from the storage region to the drain can be set to satisfy simultaneously requirements for the charge capacity, the isolation of channel charge from the drain charge, and the voltage setting on the drain. In FIG. 10, the channel potential at the point of overflow between the storage region and the drain is plotted versus the voltage applied to the drain, for both the accumulation and depletion cases, with the dosage of the Drain-Encapsulating Implant as the parameter. The figure illustrates not only the process latitude available for the Drain-Encapsulating Implant, but also indicates the sensitivity of the overflow barrier potential to process variations. Moreover, the figure indicates the extent to which a particular selection for the implant dosage and the drain voltage achieves three specific design requirements: (1) the Charge Capacity Margin, defined as the difference between the overflow potential and the storage region potential in accumulation; (2) the Drain Margin, defined as the difference between the overflow potential and the drain Fermi level, in the accumulation and in the depletion modes; and (3) the Transfer Margin, defined as the difference between the overflow potential and the transfer region potential in depletion. A satisfactory design should seek to maximize all three of these margins. FIG. 10, moreover, indicates to what extent the Charge Capacity Margin can be lowered for the purpose of charge elimination, when a large bias is applied to the drain. Such a feature would provide electronic shuttering capability to the imager. It should also be observed that due to the effects of drain depletion, a limit on the applied drain voltage is encountered for large biases. This effect is most prominent for the cases in which the drain has been heavily compensated by large dosages of the Drain-Encapsulated Implant. When the depletion limit is reached, the barrier to overflow becomes saturated at a fixed level, as illustrated in FIG. 10.

Figure 11:
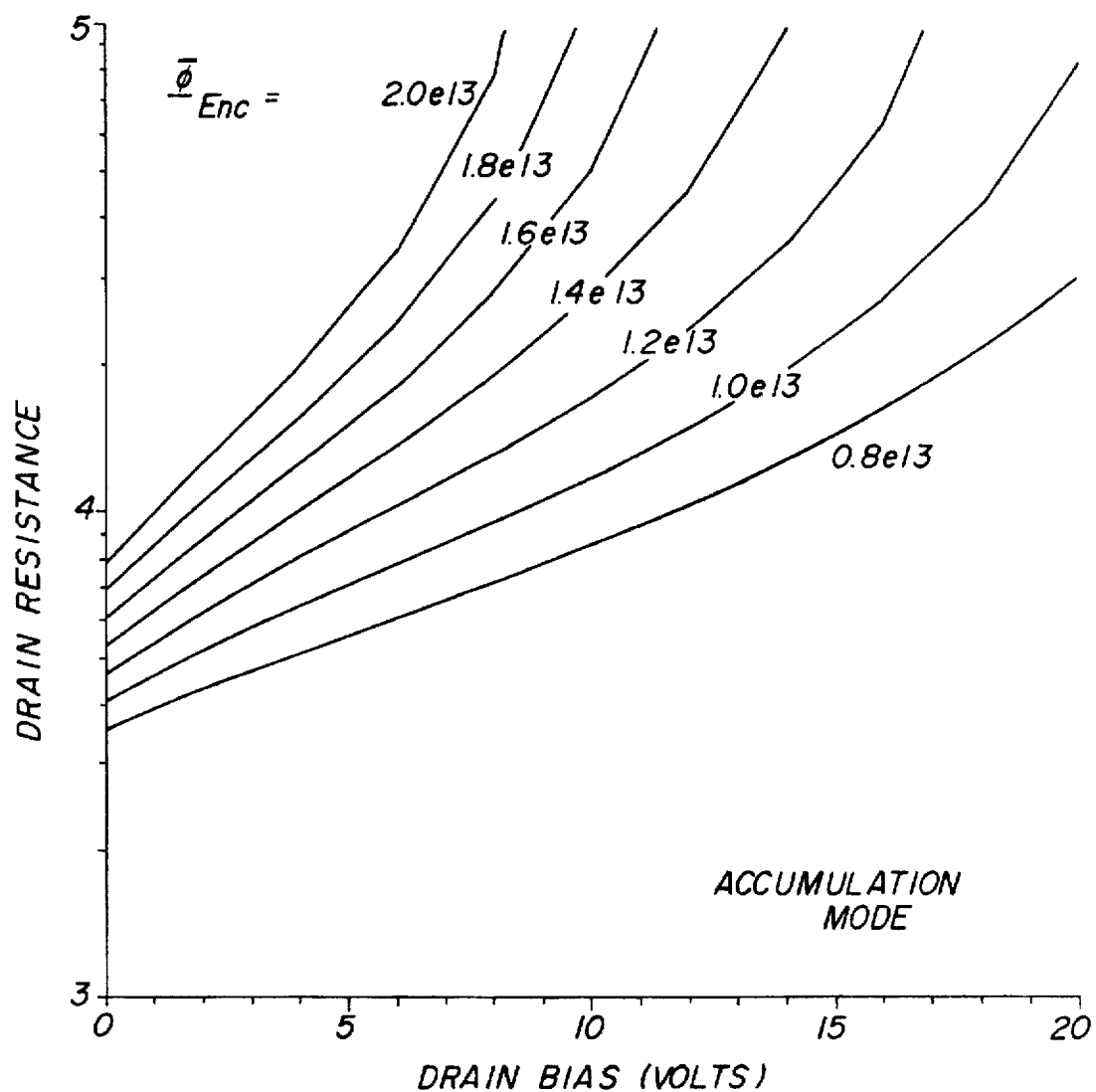
FIG. 11 plots the drain resistance in the accumulation mode as a function of applied drain voltage.

Another consequence of the drain depletion is the loss of drain conductivity, or equivalently an increase in drain resistance, as shown in FIG. 11 for the accumulation mode, as a function of the drain bias with the dosage of the Drain-Encapsulated Implant as a parameter. Although the drain becomes fully depleted in the case of the lighter drain dosages and higher drain biases, it is conceivable that the overflow charge entering the drain could restore enough conductivity to the drain to allow the drain to operate in some reduced mode.

Figure 12A:
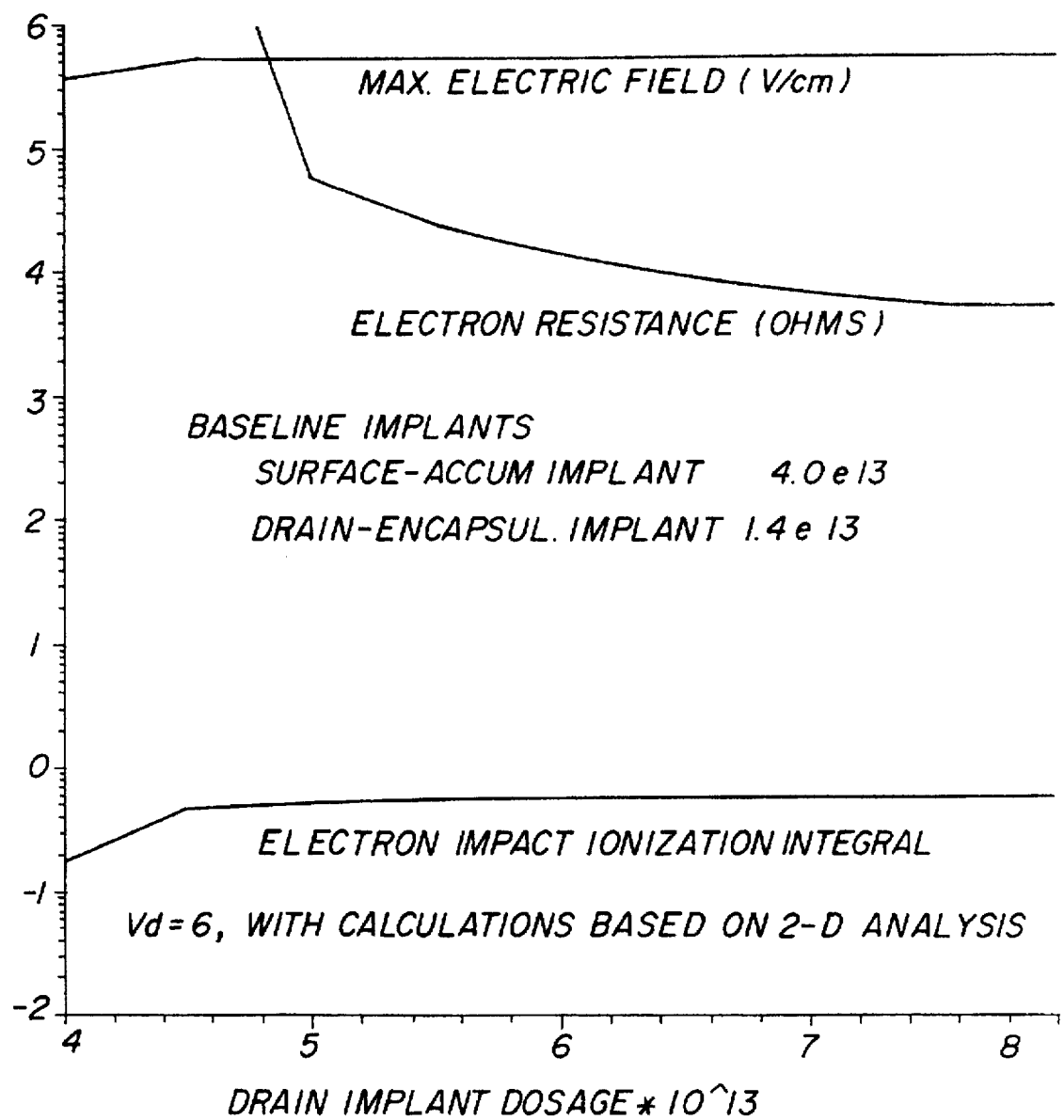
FIGS. 12(a) and 12(b) illustrate the resistance, maximum electric field, and the electron impact ionization integral as a function of the Drain Implant dosage and the Surface-Accumulating Implant dosage, respectively, for the example case in which Phosphorus impurities have been selected for the drain implantation.
Figure 12B:
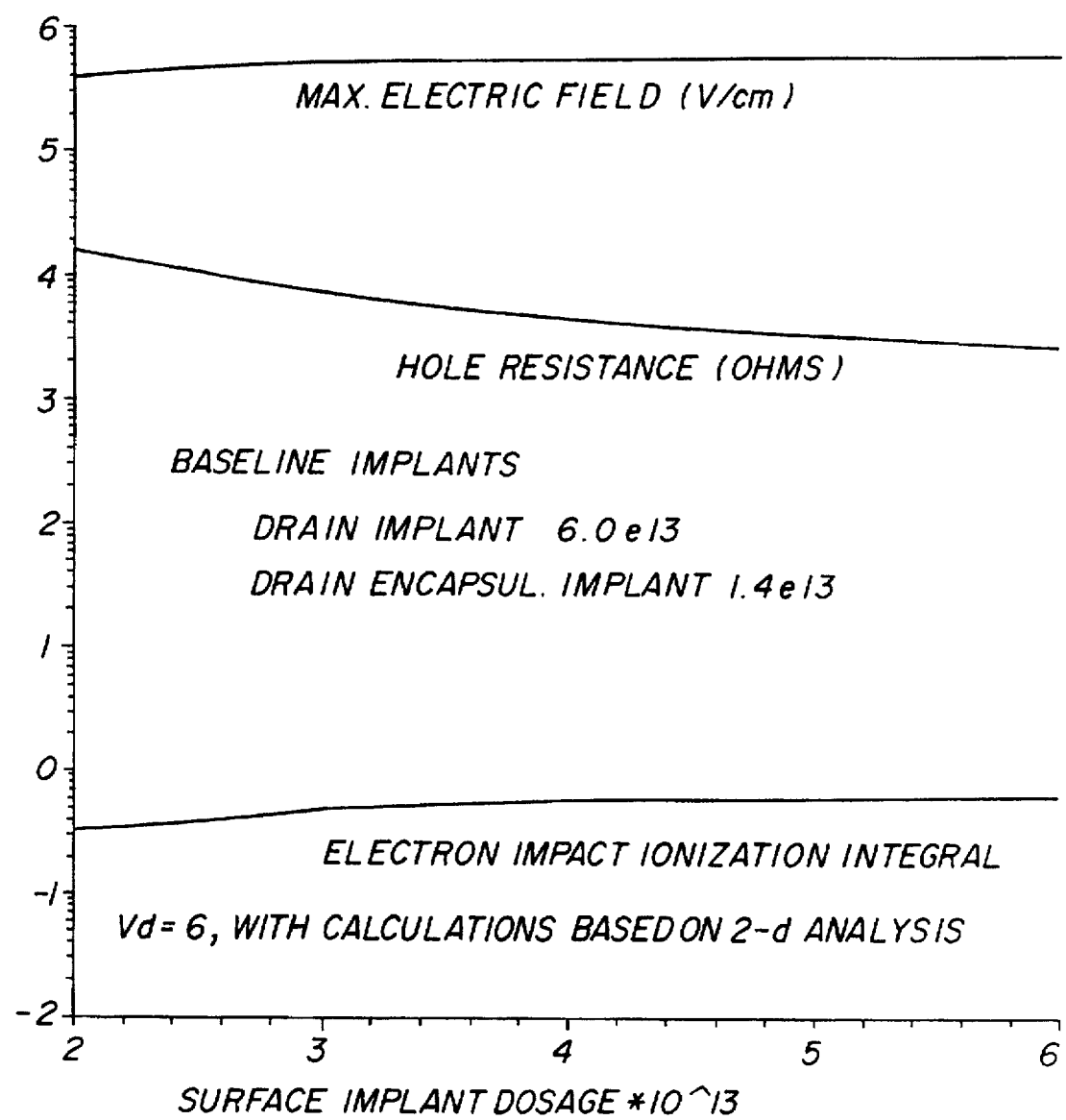

While a large dosage for the Drain Implant would seem desirable in order to minimize the loss of drain conductance, it should be noted that high doping concentrations can give rise to high electric fields that in turn can cause charge generation by means of impact ionization. The same concerns are raised with regard to the surface-accumulating region, where a high sheet conductivity is desired with negligible incidence of impact ionization. In order to examine the effects of heavy doping on both the sheet resistivity and the impact ionization, the vertical profile shown in FIG. 5 has been selected for analysis, since both the doping distribution and the electric fields experience their maximum values along this vertical path. In FIGS. 12(a) and 12(b), the resistance, maximum electric field, and the electron impact ionization integral are shown as a function of the Drain Implant dosage and the Surface-Accumulating Implant dosage, respectively, with all other implants set at the baseline values shown in FIG. 5. It is clear from FIGS. 12(a) and 12(b) that to ensure a low value for the impactionization integral, it is necessary to select the lowest possible values for the Drain Implant and Surface-Accumulation Implant dosages and the lowest possible drain bias that achieve the required potential margins described in FIG. 10, while still providing an adequate amount of sheet conductance. In practice, it is observed that a typical device can easily withstand electric fields as high a $3\times10^5$ to $5\times10^5$ V/cm, before the onset of breakdown. From FIGS. 12(a) and 12(b), these requirements are shown to be readily achievable.

To conclude this section, a Vertically-Integrated Isolation and Anti-Blooming Structure, featuring a Phosphorus-implanted drain, has been proposed and examined in detail with process and device modeling tools. The operational aspects of the structure have been fully described and several performance parameters have been defined. Studies to determine the trade-off in the performance parameters and the sensitivity to process variations have also been made. These studies show the proposed structure to easily meet the requirements of high dynamic range, complete charge containment, tunable overflow control, reduced clock voltage, wide process latitude, and therefore high manufacturability.

Second Preferred Embodiment Arsenic Implanted Drain

The second preferred embodiment employs Arsenic to form the drain 130. Dosages and energies of implants typical to produce this structure include: $4.5\times10^{13}$ cm$^{-2}$ Arsenic at 400 KeV for the Drain Implant 130, $3.0\times10^{13}$ cm$^{-2}$ Boron at 30 KeV for the Surface-Accumulating Implant 30, $3.0\times10^{13}$ cm$^{-2}$ Boron at 150 KeV for the Drain-Encapsulating Implant 140, and $3.15\times10^{12}$ cm$^{-2}$ Arsenic at 175 KeV for the Buried Channel Implant. The implantation occurred through a 0.6 micron opening. No spacer was used. To form the transfer region of the CCD, a p-type Boron implant is used to compensate the Buried Channel Implant, with a typical dosage of $1.9\times10^{12}$ cm$^{-2}$ at 150 KeV. As before, oxidation and annealing steps effectively totaling about 175 minutes at 950 K were applied in the simulation to produce the final dopant distributions.

The use of a spacer for an Arsenic drain is less critical than in the case of a Phosphorus drain since the diffusion coefficient of Arsenic is much lower than that of Phosphorus and Boron. Hence, Arsenic impurities comprising the Drain Implant never exceed the lateral extent of the boron impurities of the Drain-Encapsulating Implant after thermal processing. Therefore, in the case of the Arsenic drain, no spacer is needed, resulting in a simpler process with the likelihood of superior alignment control.

Figure 13:
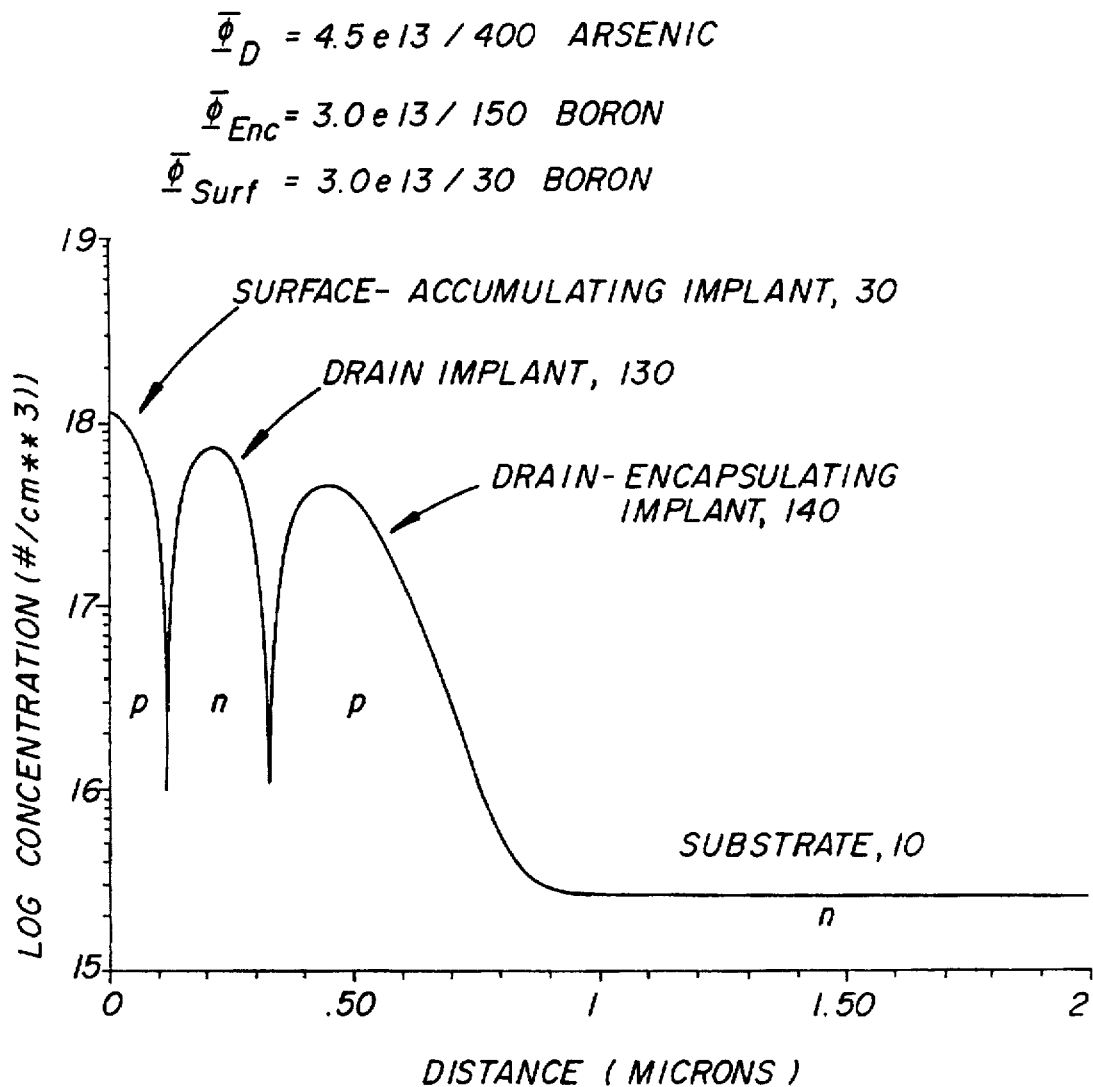
FIG. 13 shows the vertical doping profile corresponding to x=0 in FIG. 3, for an example case in which Arsenic impurities have been selected for the drain implantation.

The following discussion mirrors that presented for the first example. A plot of the vertical doping distribution produced by the above process, corresponding to x=0.0 in FIG. 3, is shown in FIG. 13. The Surface-Accumulating Implant, Drain Implant, and Drain-Encapsulating Implants are all clearly visible, with the peaks of these implants occurring at 0.0, 0.25, and 0.50 microns, respectively, relative to the semiconductor surface.

Figure 14A:
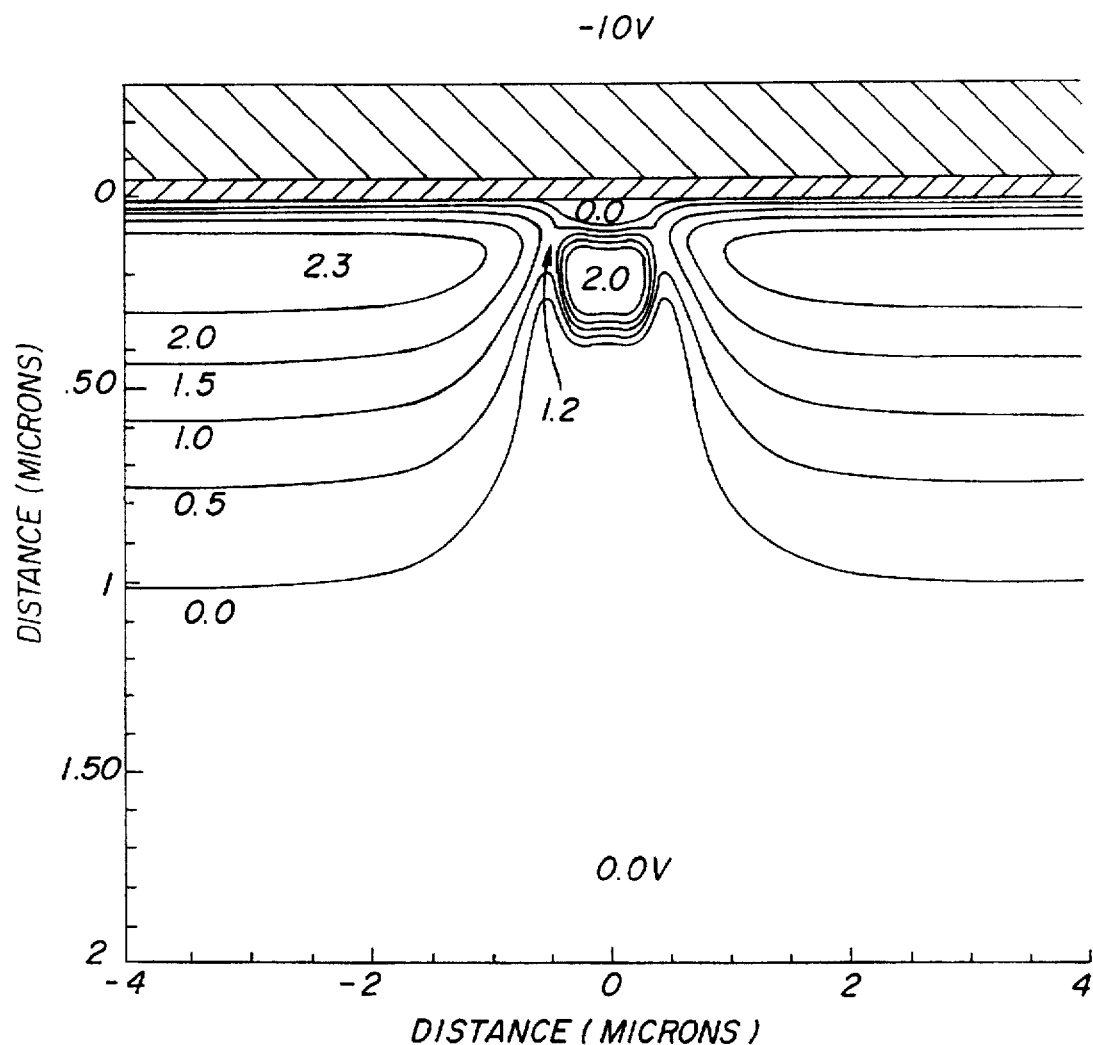
FIG. 14(a) shows contours of constant electrostatic potential for the cross-sectional view corresponding to line A–A' in FIG. 2 where Arsenic impurities implanted within the drain for drain voltages of 2 volts.
Figure 14:
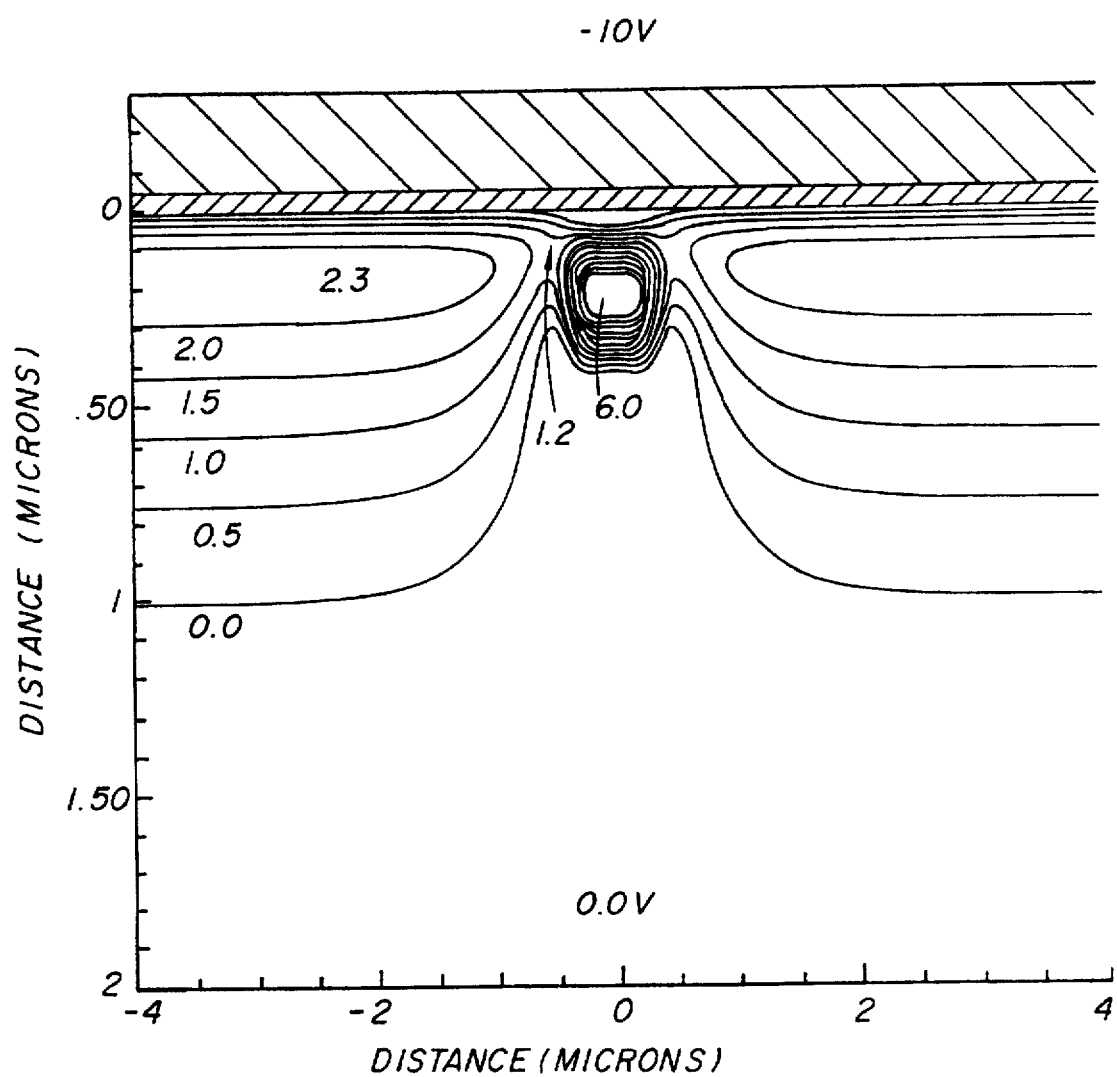
FIG. 14(b) illustrates the contours of FIG. 14(a) with drain voltages of 6 volts.
FIG. 14(c) illustrates the contours shown in FIG. 14(a) with drain voltages of 18 volts.

FIG. 14(a) is now presented to illustrate the operation of the charge overflow mechanism for the structure drawn in FIG. 3, when an Arsenic drain such as the one shown in FIG. 13, is introduced. In FIG. 14(a) are displayed contours of the constant electrostatic potential. These contours were obtained from solution to Poisson's equation by the semiconductor device program in two-dimensions. In this figure, the device is biased in the accumulation mode; that is, a large negative bias (−10 Volts, in this example) is applied to the polysilicon electrode 40 of FIG. 3, while the substrate 10 and the surface-accumulating region 30 (or channel stop) are held at 0 Volts. The buried channel regions 110 are fully depleted by setting the electron Fermi level to a large positive value (20 Volts, for instance). As can be seen in FIG. 14(a), the channel potential in the buried channel regions is 2.3 Volts in the accumulation mode. The drain region is biased to 2 Volts and remains highly conductive due to the high n-type dopant concentration. Examining the path corresponding to the dashed lines 170 in FIG. 3, it is found that if a small number of electrons were to be introduced into the buried channel region, these electrons would be completely isolated from the electron Fermi sea, positioned at 2 Volts in the drain, by an electrostatic barrier produced by the presence of the p-type impurities in region 140. Isolation from the drain would be maintained as the electron Fermi level in the buried channel region is increased, until a level of about 1.2 Volts is reached. Beyond this point, the excess charge would spill into the drain. In conclusion, it is demonstrated that a signal packet of about 1.1 Volts of electron charge can be stored in the buried channels during charge integration before spill-over into the drain occurs.

Figure 14C:
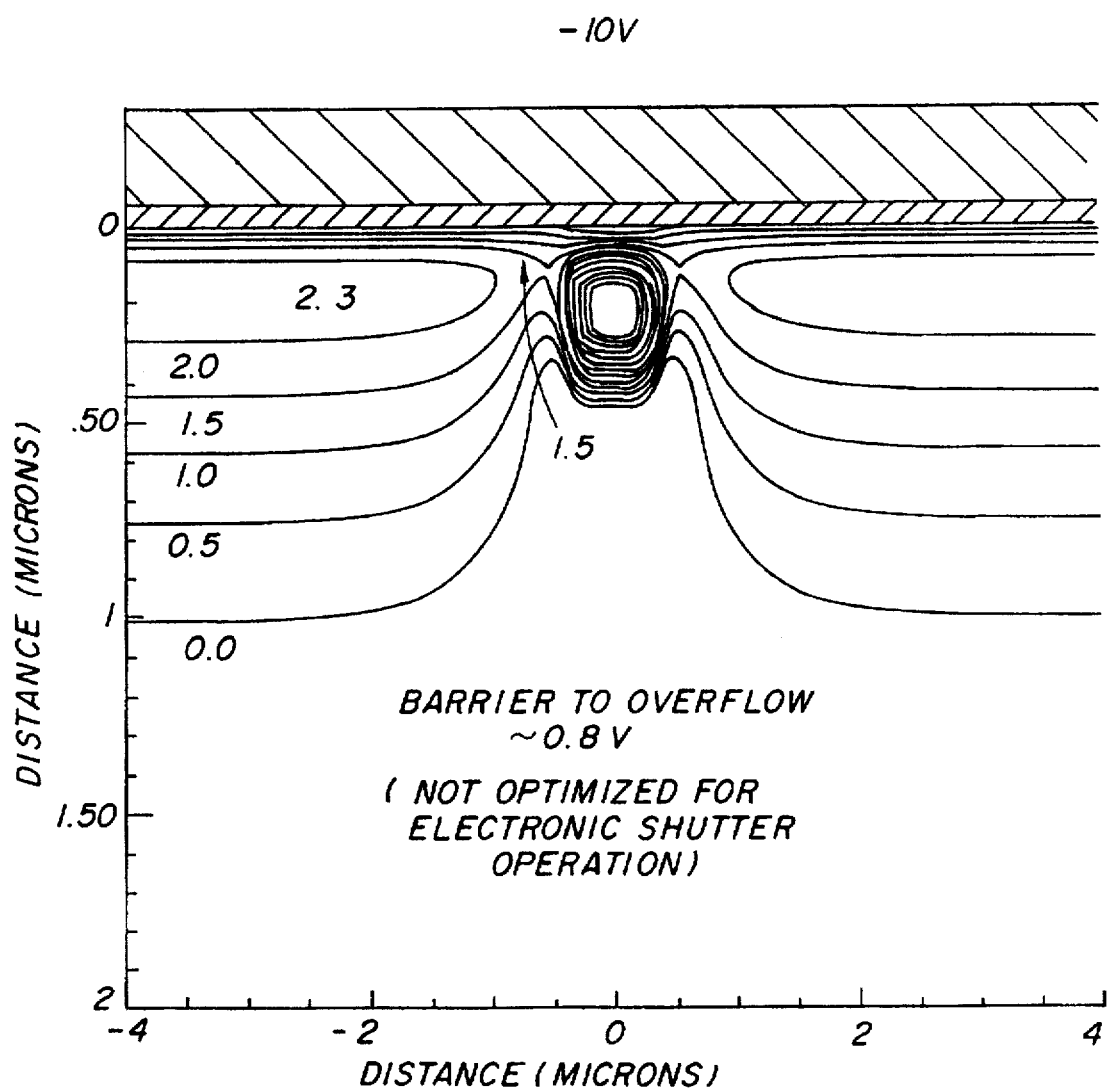

As FIG. 14(b) illustrates, the point of overflow can be controlled electronically (though not as easily as in the case with a Phosphorus drain) by adjusting the drain bias. When 6 Volts are applied to the drain, the point of overflow occurs at slightly greater than 1.2 Volts. In this case, the signal packet stored in the buried channels would be reduced to about 1.0 Volts of electron charge. Finally, by applying a large enough bias to the drain, it is possible to partially empty the buried channel region of charge, as illustrated in FIG. 14(c) where 18 Volts is applied to the drain. Later it will be shown that the doping level and cross-sectional area of the drain set a limit on the maximum voltage that can be applied to the drain, due to the effects of depletion.

From FIGS. 14(a)–14(c), it is clear that a supply of majority carrier holes from the channel stop region to the buried channels during accumulation mode operation, along the path described by lines 180 in FIG. 3, is always readily available. Indeed, the surface-accumulating region 30 is never depleted of holes, even in the case of 18 Volts applied to the drain. This fact can be substantiated by observing that the surface-accumulating region in all cases remains at 0 Volts.

Figure 15A:
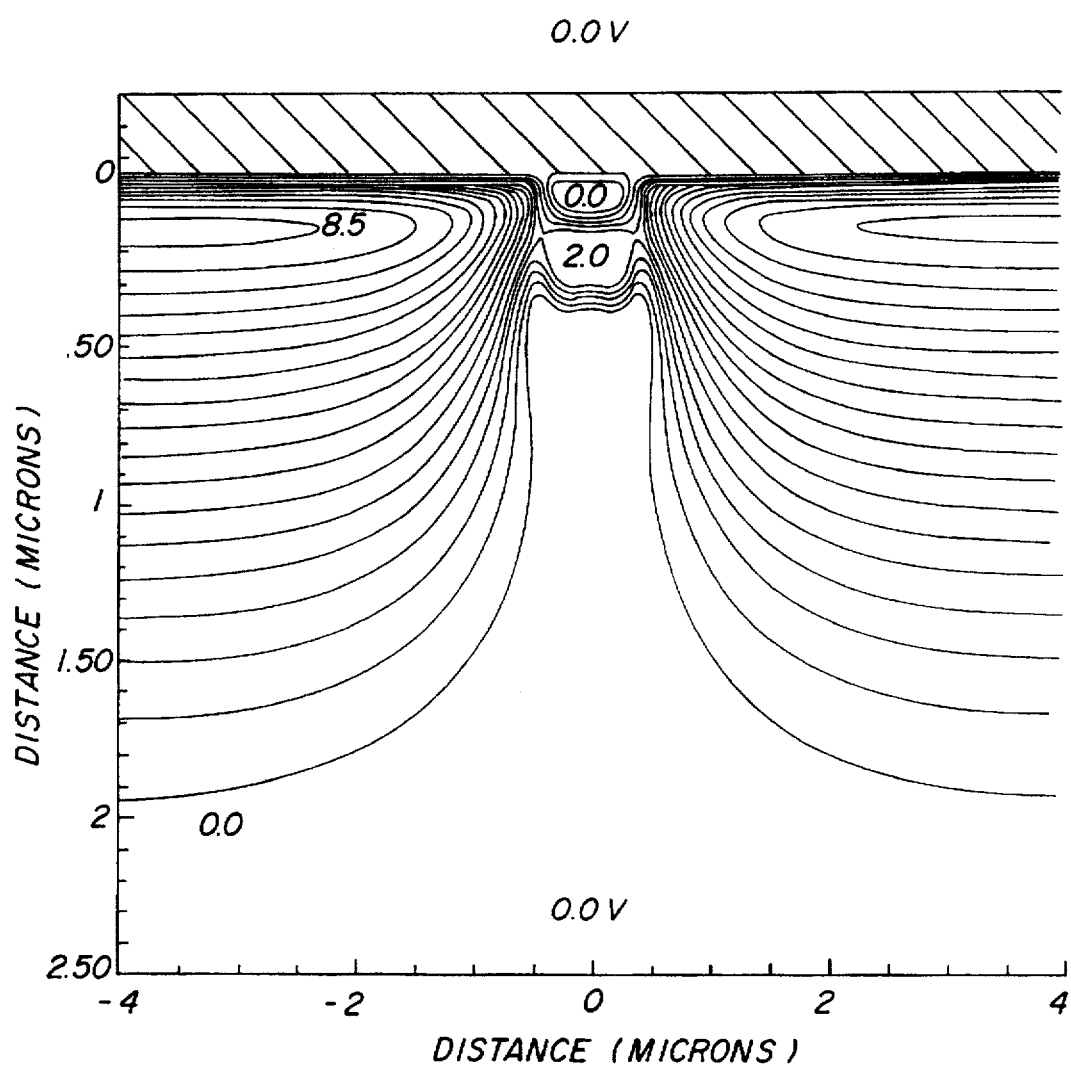
FIG. 15(a) shows contours of constant electrostatic potential for the cross-sectional view corresponding to line A–A' in FIG. 2 with Arsenic impurities selected for drain implantation operating in the depletion mode with 0 Volts on the gate electrode for a drain voltage 2 volts.
Figure 15B:
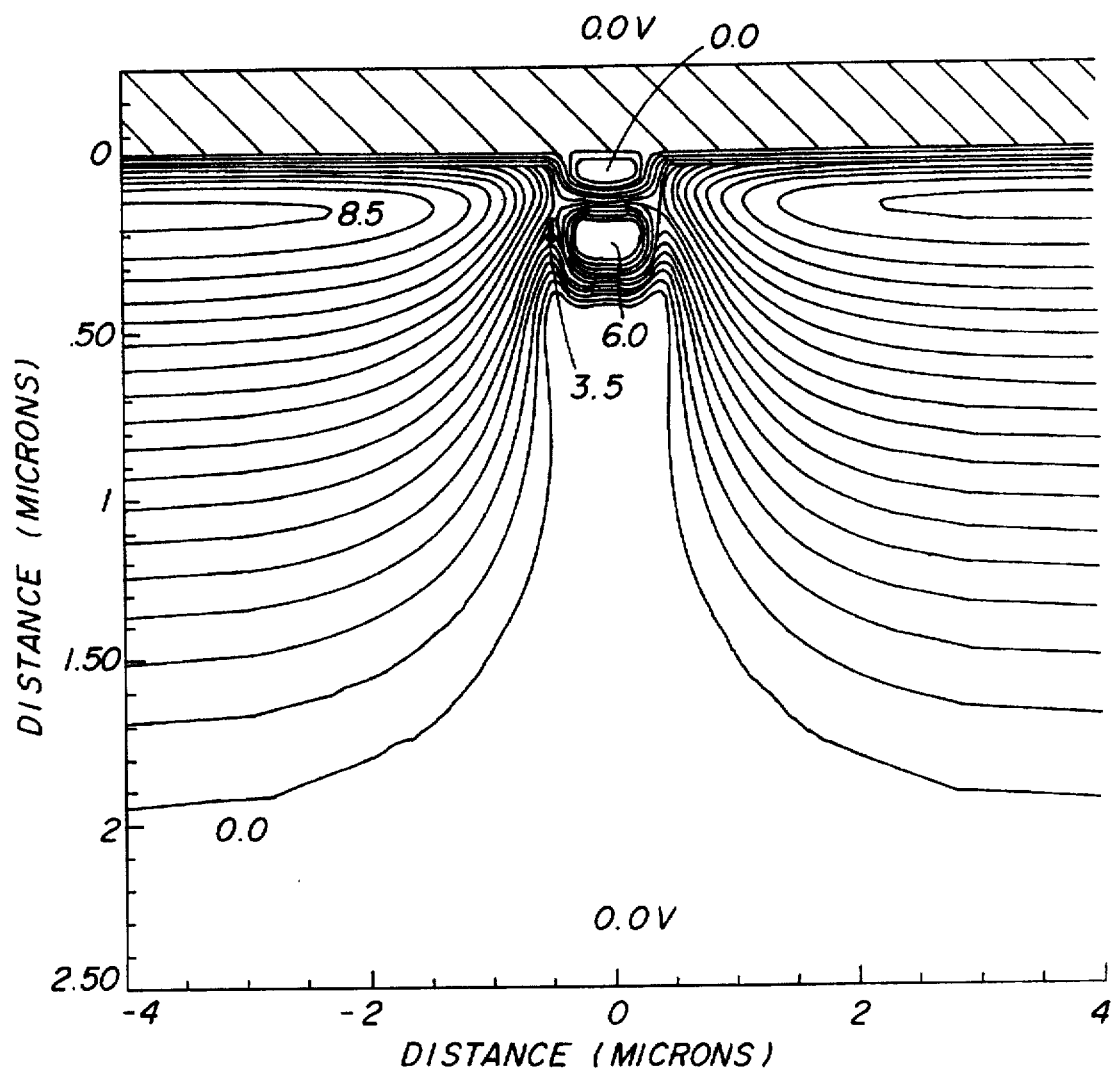
FIG. 15(b) illustrates the contours of FIG. 15(a) with a drain voltage of 6 volts.
Figure 15C:
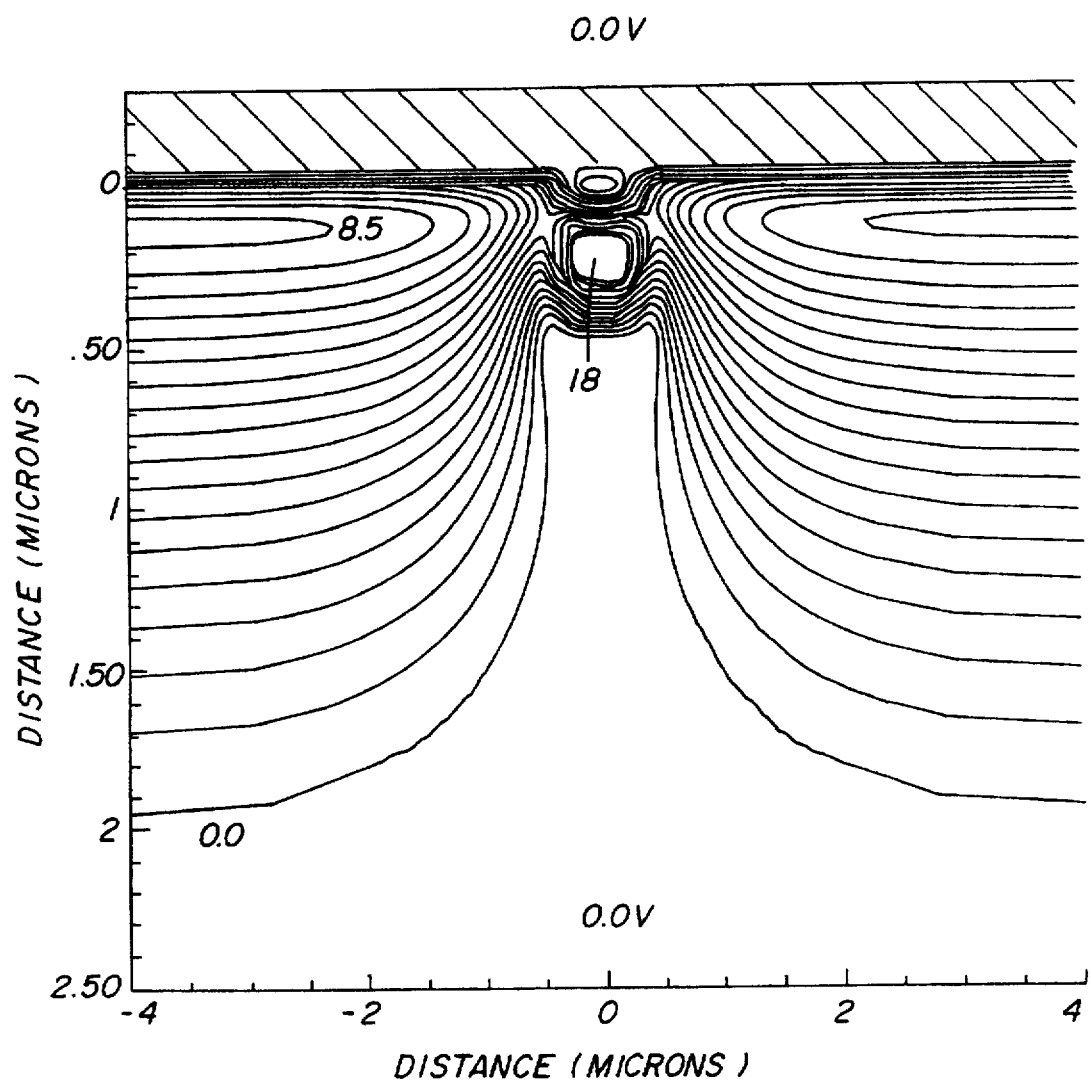
FIG. 15(c) illustrates the contours of FIG. 15(a) with a drain voltage of 18 volts.

After the charge integration period is completed, it is necessary to apply a sequence of clock voltages to the polysilicon gates 40 and 50 that alternate between the accumulation mode (−10 Volts on the gate) and the depletion mode (0 Volts on the gate) in order to transfer charge down the vertical shift registers 20 and into the horizontal shift register 70, as shown in FIG. 2. It is therefore important to examine the charge containment properties for the buried channels while in the depletion mode. FIGS. 15(a)–15(c) present contours for the electrostatic potential in the depletion mode, for a series of drain voltages corresponding to those used in FIGS. 14(a)–14(c).

As we shall now see, selection of the drain bias is critical to proper operation of the structure, especially in the depletion mode. Obviously, electron charge must not be lost to the overflow drain while in depletion mode, nor must electron charge be inadvertently introduced from the overflow drain to the buried channels. In FIG. 15(a), for example, with 0 Volts applied to the gate, it is observed that a 2 Volt setting on the drain does not provide sufficient isolation of the electron Fermi sea in the drain from electrons in the buried channel regions. Electrons would actually surmount the small potential barrier and flow directly from the drain into the buried channels, eventually raising the Fermi level in the buried channels to a level comparable to that in the drain. However, when the drain is set to 6 Volts, as shown in FIG. 15(b), the electron charges in the drain and in the buried channel are again fully isolated from each other. From the figure, it is seen that the channel potential at the point of overflow from the storage region to the drain is 3.5 Volts. This voltage setting on the drain is representative of many voltage settings in the vicinity of 6 Volts that will simultaneously satisfy the requirements of precise overflow control in the accumulation mode and isolation of the drain and buried channel regions in the depletion mode. FIG. 15(c) indicates that for even larger voltages (18 Volts) on the drain, excellent isolation of the drain and buried channel regions is maintained. The results presented in FIGS. 14(c) and 15(c) also demonstrate that the discharge of electrons from the buried channel regions into the drain is more readily accomplished while in the accumulation mode.

Figure 16A:
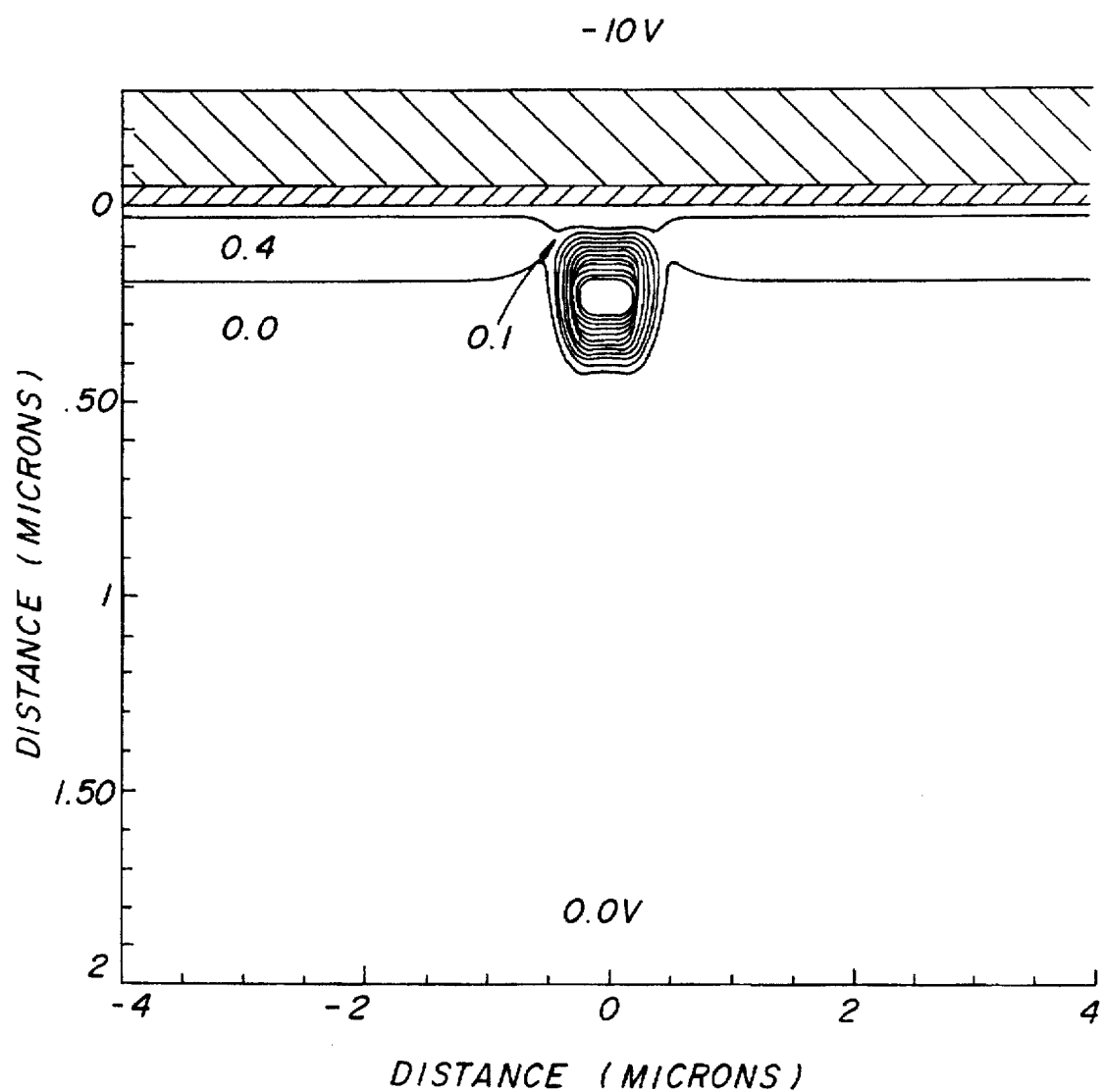
FIG. 16(a) shows contours of constant electrostatic potential for the cross-sectional view corresponding to line B–B' in FIG. 2 for Arsenic impurities used for drain implantation operating in the accumulation mode with −10 Volts on the gate and a drain voltage setting of 6 Volts.
Figure 16B:
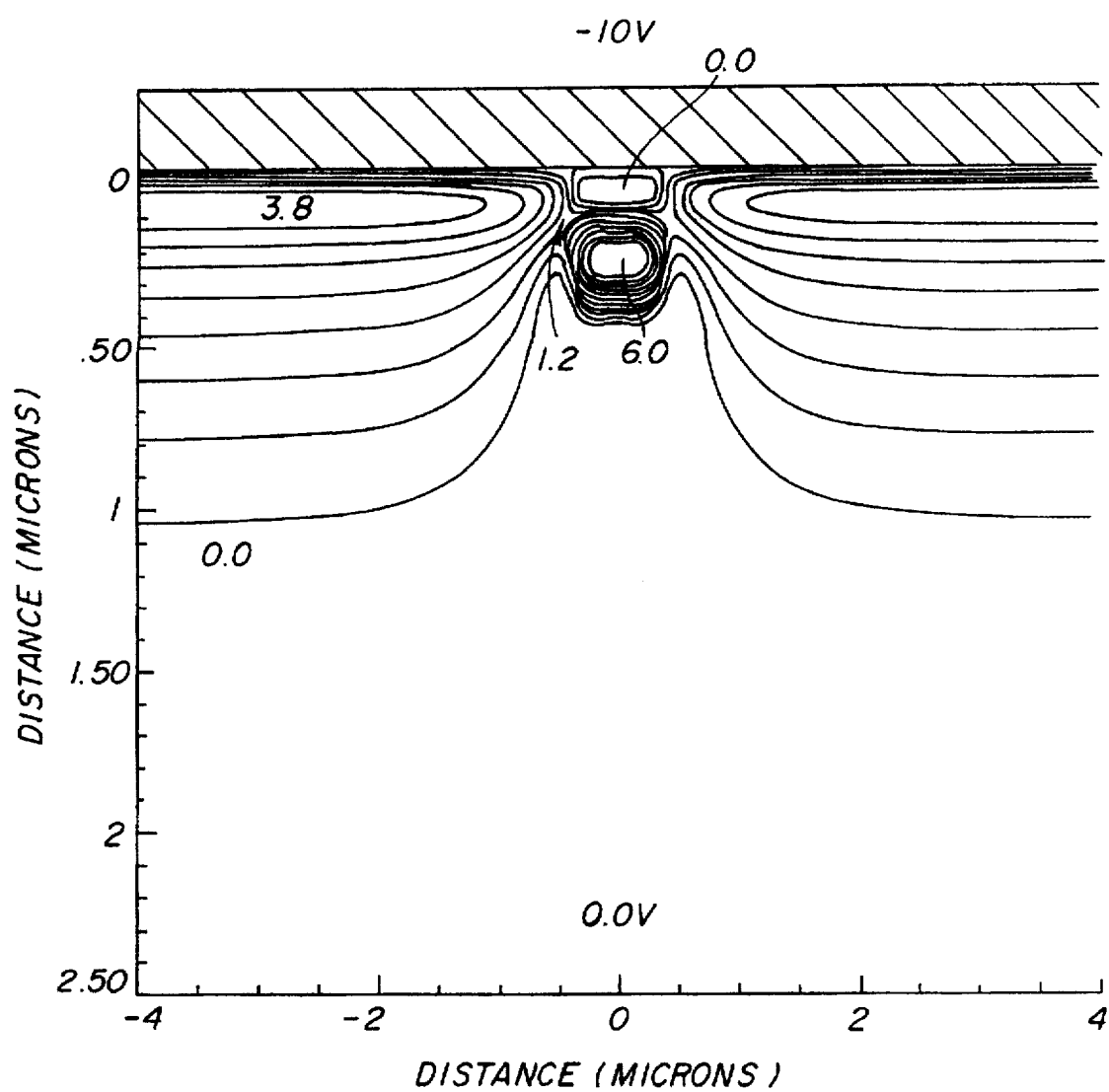
FIGS. 16(b) shows contours of constant electrostatic potential for the cross-sectional view corresponding to line B–B' in FIG. 2 with Arsenic impurities selected for drain implantation operating in the depletion mode with 0 Volts on the gate and a drain voltage setting of 6 Volts.

It is also important to examine the operational aspects of the overflow drain along the line B–B', shown in FIG. 2, in the transfer region of the device. Contours of the constant electrostatic potential in the cross-section corresponding to the line B–B' are shown in FIGS. 16(a) and 16(b). FIG. 16(a) shows that the channel potential in the transfer region is 0.4 Volts and, for operation in the accumulation mode (−10 Volts on the gate) and with the drain set to 6 Volts, the potential at the point of overflow from the transfer region to the drain is very close to 0 Volts. For operation in the depletion mode (0 Volts on the gate) and with the drain set to 6 Volts, the channel potential in the transfer region is 3.8 Volts and the potential at the point of overflow from the transfer region to the drain is 1.2 Volt.

Figure 17A:
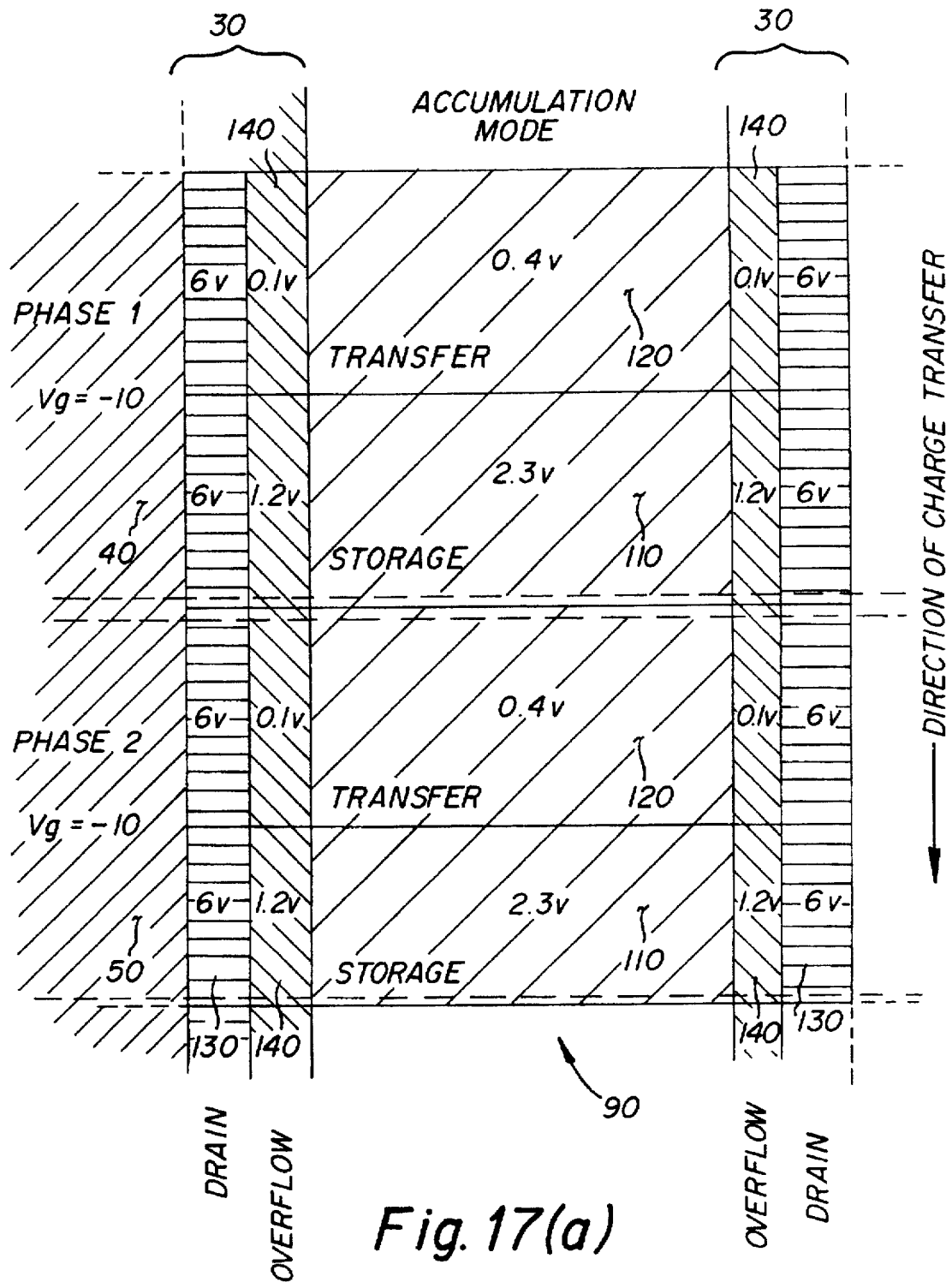
FIG. 17(a) illustrates the channel potentials in the various regions of two adjacent phases in a pixel operated in the accumulation mode, where Arsenic impurities are used for drain implantation.
Figure 17B:
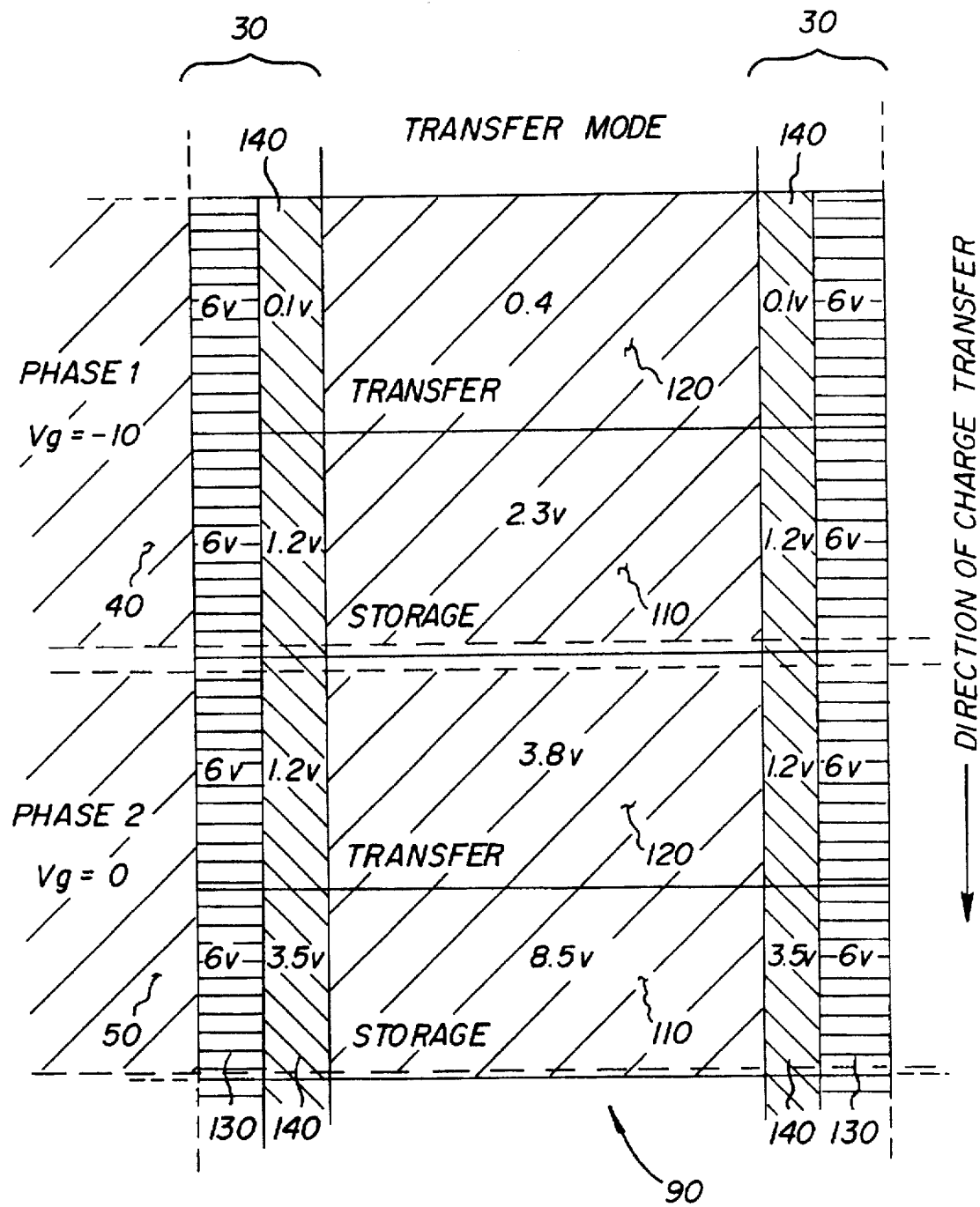
FIG. 17(b) illustrates the channel potentials in the various regions of two adjacent phases in a pixel operated in the transfer mode where Arsenic impurities are used for drain implantation.

In order to transfer charge without spill-over into the drain, it is extremely crucial that the potential of the overflow barrier in the transfer region be near 0 Volts in the accumulation mode; and, in the depletion mode, at a potential value less than the accumulated storage potential of the preceding phase. That these requirements are met can be verified by inspecting FIGS. 17(a) and 17(b) in which the channel potentials in two adjacent phases are shown for the charge accumulation and charge transfer modes, respectively. FIGS. 17(a) and 17(b) serve to summarize the principal results collected thus far. Note that, in the case of the charge accumulation mode, charge is collected into the storage regions of the buried channel devices, with overflow not occurring until the design level, 1.2 Volts, is reached. In the charge transfer mode, it is observed that charge passing through the transfer region will remain in the buried channels, without spilling over unintendedly into the drain. It is clear that the storage regions in depletion mode have the capacity to store all of the charge integrated during the accumulation mode, without overflow to the drain.

Figure 18:
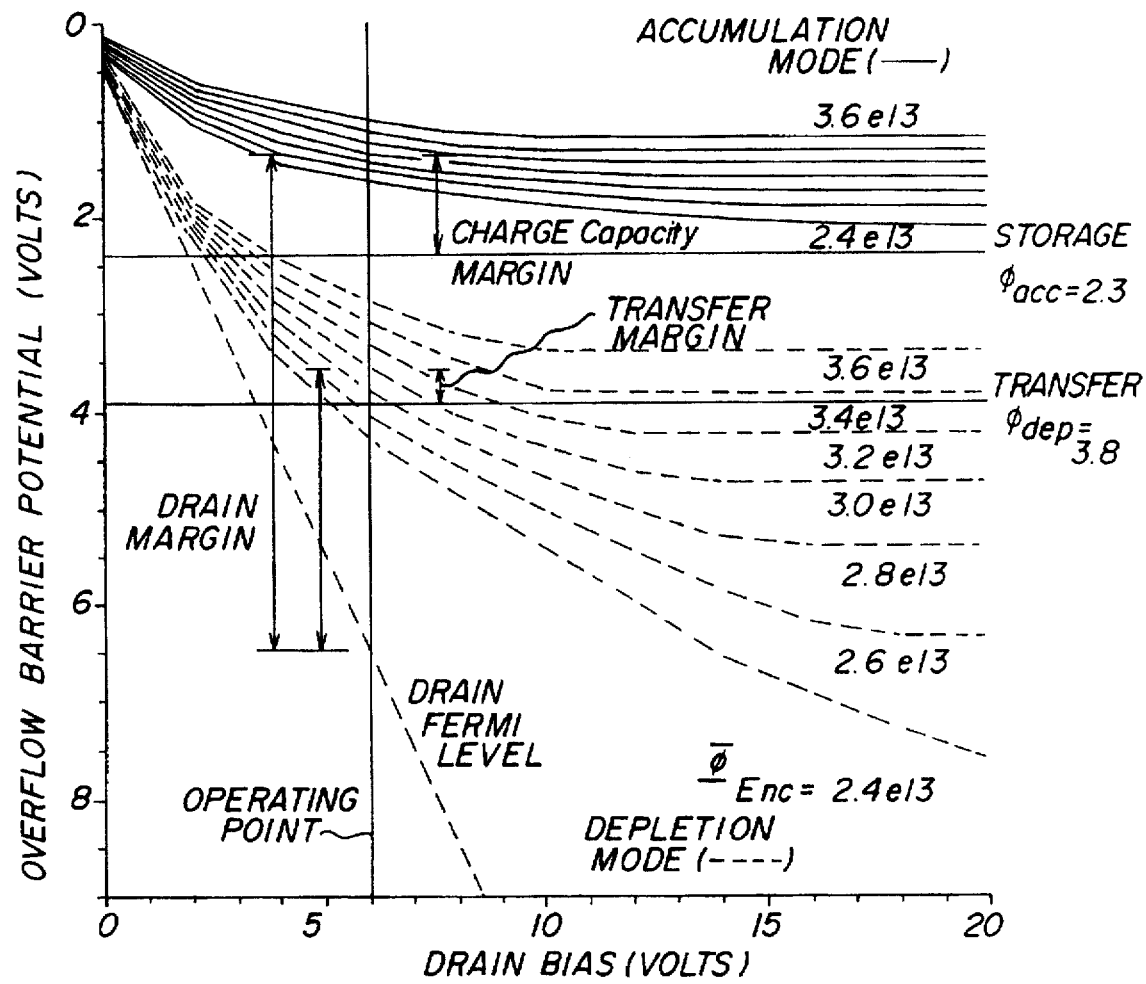
FIG. 18 plots the channel potential at the point of charge overflow from the storage region to the drain in both the accumulation and depletion modes as a function of applied drain voltage, with the dosage of the Drain-Encapsulating Implant as a parameter, where Arsenic is used for impurity concentration in the Drain Implant.
Figure 19:
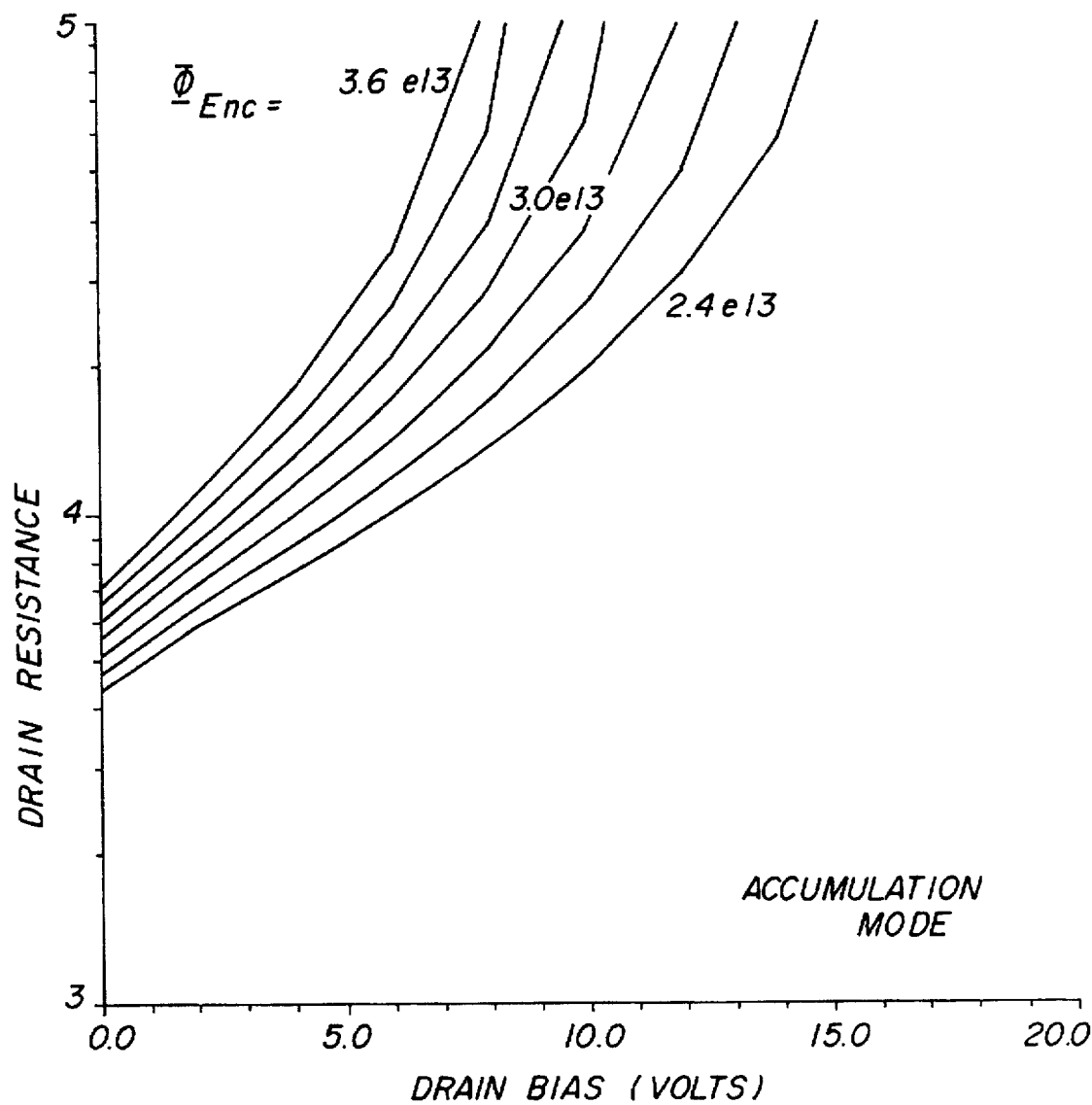
FIG. 19 plots the drain resistance in the accumulation mode as a function of applied drain voltage, with the dosage of the Drain-Encapsulating Implant as a parameter, for the example case in which Arsenic impurities have been selected for the drain implantation. All other implants are as specified by the baseline values shown in FIG. 13.

By adjusting the dosage of the Drain-Encapsulating Implant, the potential at the point of charge overflow from the storage region to the drain can be set to satisfy simultaneously requirements for the charge capacity, the isolation of channel charge from the drain charge, and the voltage setting on the drain. In FIG. 18, the channel potential at the point of overflow between the storage region and the drain is plotted versus the voltage applied to the drain, for both the accumulation and depletion cases, with the dosage of the Drain-Encapsulating Implant as the parameter. The figure illustrates not only the process latitude available for the Drain-Encapsulating Implant, but also indicates the sensitivity of the overflow barrier potential to process variations. Moreover, the figure indicates the extent to which a particular selection for the implant dosage and the drain voltage achieves three specific design requirements: (1) the Charge Capacity Margin, defined as the difference between the overflow potential and the storage region potential in accumulation; (2) the Drain Margin, defined as the difference between the overflow potential and the drain Fermi level, in the accumulation and in the depletion modes; and (3) the Transfer Margin, defined as the difference between the overflow potential and the transfer region potential in depletion. A satisfactory design should seek to maximize all three of these margins. FIG. 18, moreover, indicates to what extent the Charge Capacity Margin can be lowered for the purpose of charge elimination, when a large bias is applied to the drain. Such a feature would provide electronic shuttering capability to the imager. It should also be observed that due to the effects of drain depletion, a limit on the applied drain voltage is encountered for large biases. This effect is most prominent for the cases in which the drain has been heavily compensated by large dosages of the Drain-Encapsulated Implant. When the depletion limit is reached, the barrier to overflow becomes saturated at a fixed level, as illustrated in FIG. 18. Another consequence of the drain depletion is the loss of drain conductivity, or equivalently an increase in drain resistance, as shown in FIG. 19 for the accumulation mode, as a function of the drain bias with the dosage of the Drain-Encapsulated Implant as a parameter. (Although the drain becomes fully depleted in the case of the lighter drain dosages and higher drain biases, it is conceivable that the overflow charge entering the drain could restore enough conductivity to the drain to allow the drain to operate in some reduced mode).

Figure 20A:
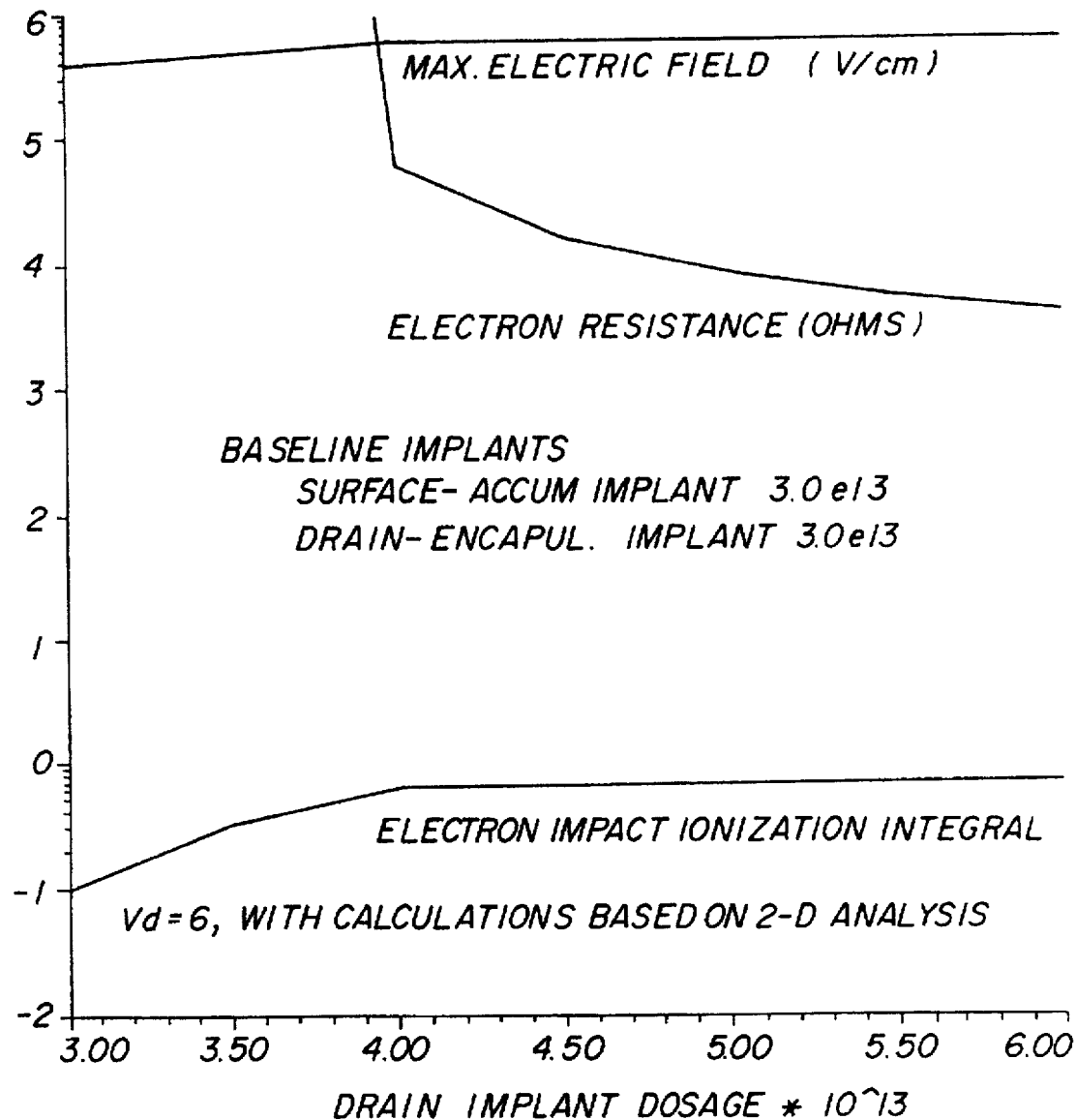
FIG. 20(a) illustrates the resistance, maximum electric field and the electron impact ionization integral as a function of the Drain Implant dosage for the example case in which Arsenic impurities are used for drain implantation.
Figure 20B:
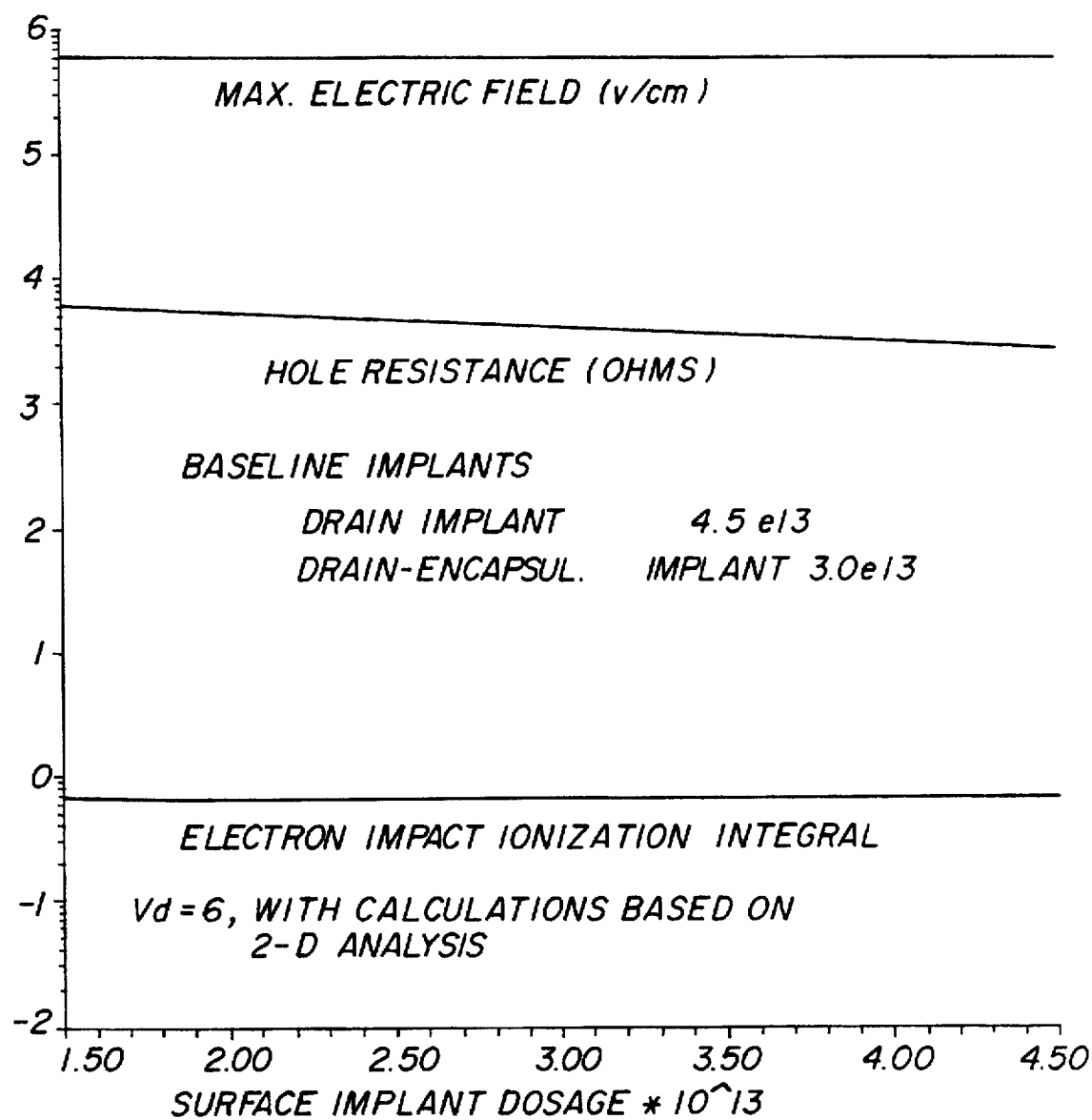
FIG. 20(b) illustrates the resistance, maximum electric field, and the electron impact ionization integral as a function Surface-Accumulating Implant dosage for the example where Arsenic impurities are used for drain implantation.

While a large dosage for the Drain Implant would seem desirable in order to minimize the loss of drain conductance, it should be noted that high doping concentrations can give rise to high electric fields that in turn can cause charge generation by means of impact ionization. The same concerns are raised with regard to the surface-accumulating region, where a high sheet conductivity is desired with negligible incidence of impact ionization. In order to examine the effects of heavy doping on both the sheet resistivity and the impact ionization, the vertical profile shown in FIG. 5 has been selected for analysis, since both the doping distribution and the electric fields experience their maximum values along this vertical path. In FIGS. 20(a) and 20(b), the resistance, maximum electric field, and the electron impact ionization integral are shown as a function of the Drain Implant dosage and the Surface-Accumulating Implant dosage, respectively, with all other implants set at the baseline values shown in FIG. 5. It is clear from FIGS. 20(a) and 20(b) that to ensure a low value for the impact ionization integral, it is necessary to select the lowest possible values for the Drain Implant and Surface-Accumulation Implant dosages and the lowest possible drain bias that achieve the required potential margins described in FIG. 18, while still providing an adequate amount of sheet conductance. In practice, it is observed that a typical device can easily withstand electric fields as high a $3\times10^5$ to $5\times10^5$ V/cm, before the onset of breakdown. From FIGS. 20(a) and 20(b), these requirements are shown to be readily achievable.

To conclude this section, a Vertically-Integrated Isolation and Antiblooming Structure, featuring an Arsenic-implanted drain, has been proposed and examined in detail with process and device modeling tools. The operational aspects of the structure have been fully described and several performance parameters have been defined. Studies to determine the trade-off in the performance parameters and the sensitivity to process variations have also been made. These studies show the proposed structure to easily meet the requirements of high dynamic range, complete charge containment, tunable overflow control, reduced clock voltage, wide process latitude, and therefore high manufacturability.

The invention has been described with reference to a preferred embodiment. However, it will be appreciated that variations and modifications can be effected by a person of ordinary skill in the art without departing from the scope of the invention.

Parts Lists
5imaging array
10substrate
20vertical shift register
30channel stops
30surface-accumulating implants
40polysilicon gate
50polysilicon gate
60clocking circuitry
70horizontal shift register
80output node
90pixel
110storage region
120transfer region
130drain
140drain-encapsulating region
160gate oxide
170dashed lines
180dashed lines
190mask
200mask opening
210mask opening

We claim:
1. An image sensing device comprising:
   a) a semiconductor substrate of p-type conductivity;
   b) a buried channel CCD, formed on a surface of the substrate by implantation of n-type impurities uniformly over the substrate surface;
   c) at least one overflow drain formed by an implantation of n-type impurities below the surface of the semiconductor substrate with a dose of n-type impurities sufficiently large enough to ensure a region of high n-type conductivity;
   d) a drain-encapsulating region, formed by an implantation of p-type impurities positioned in the substrate so as to completely envelope the n-type overflow drain; with p-type impurities having a concentration that is substantially higher than the substrate; and
   e) a surface-accumulating region formed by an implantation of p-type impurities positioned in the substrate above the overflow drain, near the surface of the substrate.

2. The image sensor of claim 1 wherein the surface-accumulating region is formed with a dose of p-type impurities sufficiently large to ensure the n-type impurities introduced into this region by the Buried Channel Implant are fully compensated and that the region is permanently accumulated with holes.

3. The sensor of claim 1 wherein the Overflow Drain Implant is narrower than both the Drain-Encapsulating Implant and the Surface-Accumulating Implant.

4. The image sensor of claim 1 wherein the n-type drain impurities are contained and separated from the n-type buried channel impurities by the p-type impurities forming the Drain-Encapsulating Implant.

5. The image sensor of claim 1 further comprising containment means to limit lateral extension of the n-type drain impurities.

6. The image sensor of claim 5 wherein the containment means provides that n-type impurities used for creating the drain remain fully separated from the n-type buried channel impurities by the intervening p-type impurities from the Drain-Encapsulating Implant.

7. The image sensor of claim 1 wherein the drain-encapsulating region is formed from boron ions.

8. The image sensor of claim 1 wherein the surface-accumulating region formed by p-type impurities implanted from boron ions.

9. The image sensor of claim 1 wherein the overflow drain is formed by an implantation of n-type impurities from either arsenic or phosphorus ion.

10. An image sensing device comprising:
   a) a semiconductor substrate of a first conductivity type;
   b) a buried channel CCD, formed on a surface of the substrate type by uniformly implanting impurities of a second conductivity type opposite the first conductivity over the surface;
   c) an overflow drain formed of the second conductivity type below the surface of the semiconductor substrate with a dose impurities of the second conductivity type sufficiently large enough to ensure a region of high second conductivity type;
   d) a drain-encapsulating region, formed by an implantation of the first conductivity type positioned in the substrate so as to completely envelope the overflow drain; and e) a surface-accumulating region formed by an implantation of the first conductivity type positioned in the substrate above the overflow drain, near the surface of the substrate.

11. The image sensing device of claim 10, wherein impurities of the second conductivity type within the drain and the buried channel are electrically separated to a predetermined potential by the drain encapsulating implant of the first conductivity type.

12. The image sensing device of claim 11 further comprising means for adjusting the predetermined potential.

13. The image sensing device of claim 12 wherein the means for adjusting the predetermined potential further comprises means for adjusting the voltage level of the drain.

14. The image sensing device of claim 12 wherein the means for adjusting the predetermined potential further comprises an electrode over the buried channel and means for adjusting the voltage level of the electrode.

* * * * *

UNITED STATES PATENT AND TRADEMARK OFFICE
CERTIFICATE OF CORRECTION

PATENT NO. : 5,714,776
DATED : 03 February 1998
INVENTOR(S) : Edmund K. Banghart, et al It is certified that error appears in the above-identified patent and that said Letters Patent is hereby corrected as shown below:

Claim 10, Column 19, line 2,

--after "drain" please insert <u>with p-type impurities having a concentration that is substantially higher than the substrate</u> --

Signed and Sealed this

Twenty-eighth Day of April, 1998

Attest:

BRUCE LEHMAN

Attesting Officer

Commissioner of Patents and Trademarks